(12) United States Patent
Honda

(10) Patent No.: US 8,441,418 B2
(45) Date of Patent: May 14, 2013

(54) LIGHT-EMITTING DEVICE AND DRIVING METHOD THEREOF

(75) Inventor: Tatsuya Honda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 957 days.

(21) Appl. No.: 12/501,837

(22) Filed: Jul. 13, 2009

(65) Prior Publication Data

US 2010/0013747 A1 Jan. 21, 2010

(30) Foreign Application Priority Data

Jul. 16, 2008 (JP) ................................ 2008-184970

(51) Int. Cl.
*G09G 3/30* (2006.01)
(52) U.S. Cl.
USPC ............................................ 345/76; 345/214
(58) Field of Classification Search .................... 345/39, 345/76, 214
See application file for complete search history.

(56) References Cited

U.S. PATENT DOCUMENTS

| | | | |
|---|---|---|---|
| 5,745,085 A | 4/1998 | Tomio et al. | |
| 6,335,713 B1 | 1/2002 | Imai | |
| 6,392,617 B1 | 5/2002 | Gleason | |
| 6,452,576 B1 | 9/2002 | Van Velzen et al. | |
| 6,528,951 B2 | 3/2003 | Yamazaki et al. | |
| 6,995,519 B2 | 2/2006 | Arnold et al. | |
| 7,365,719 B2 | 4/2008 | Miyagawa | |
| 8,026,876 B2 | 9/2011 | Nathan et al. | |
| 8,279,143 B2 | 10/2012 | Nathan et al. | |
| 2002/0105279 A1 | 8/2002 | Kimura | |
| 2002/0180672 A1 | 12/2002 | Yamazaki et al. | |
| 2003/0132716 A1 | 7/2003 | Yamazaki et al. | |
| 2004/0100463 A1 | 5/2004 | Miyagawa et al. | |
| 2004/0252085 A1 | 12/2004 | Miyagawa | |
| 2006/0214888 A1* | 9/2006 | Schneider et al. .............. 345/76 |

FOREIGN PATENT DOCUMENTS

| | | |
|---|---|---|
| JP | 2002-351403 | 12/2002 |
| JP | 2004-341368 | 12/2004 |
| JP | 2006-47668 | 2/2006 |
| JP | 2007-514966 | 6/2007 |
| JP | 2008-3456 | 1/2008 |
| JP | 2008-181005 | 8/2008 |
| JP | 2010-500620 | 1/2010 |
| WO | WO 2005/055186 A1 | 6/2005 |
| WO | WO 2008/019487 A1 | 2/2008 |

* cited by examiner

*Primary Examiner* — Joseph Feild
*Assistant Examiner* — Andrew Sasinowski
(74) *Attorney, Agent, or Firm* — Husch Blackwell LLP

(57) ABSTRACT

Charge corresponding to a potential difference between electrodes of an electroluminescence element is accumulated in a period in which the electroluminescence element emits light; the potential difference is detected without decrease in the luminance at the time of light emission of the electroluminescence element; and a reference potential of one electrode of the electroluminescence element is changed based on the detected potential difference, so that reduction in luminance of the electroluminescence element due to deterioration of the electroluminescence element is compensated.

8 Claims, 17 Drawing Sheets

LIGHT-EMITTING DEVICE AND DRIVING METHOD THEREOF

BACKGROUND OF THE INVENTION

1. Field of the Invention

The present invention relates to a light-emitting device for compensating reduction in luminance of the light-emitting device.

2. Description of the Related Art

In recent years, wide-viewing-angle, high-moving-image-characteristics light-emitting devices using electroluminescence elements (EL elements) have been developed. The EL elements, which are self-emission elements that themselves emit light, have a problem in that the luminance is likely to decrease over time. When EL elements deteriorates, resistance thereof generally increases. Therefore, under a condition in which a certain voltage is applied to an EL element, the amount of current which flows into the EL element decreases as the EL element deteriorates, which cause reduction in the luminance.

In FIG. 1, a driving transistor 101 and an EL element 102 which is electrically connected to the driving transistor 101 are shown. A gate of the driving transistor 101 is electrically connected to a signal terminal 103; one of a source and a drain of the driving transistor 101 is electrically connected to a first power source terminal 104; the other of the source and the drain of the driving transistor 101 is electrically connected to one electrode (one of an anode and a cathode) of the EL element 102; and the other electrode (the other of the anode and the cathode) of the EL element 102 is electrically connected to a second power source terminal 105. High potential (or low potential) of a power source is applied to the first power source terminal 104, and low potential (or high potential) of the power source is applied to the second power source terminal 105. The driving transistor 101 controls the current which flows into the EL element 102 to determine the luminance of the EL element 102. Description hereinbelow is made on the case where the driving transistor 101 is a p-channel transistor, but the present invention is not limited to this case of the p-channel transistor. The driving transistor 101 may be an n-channel transistor.

A curve 201 in FIG. 2A shows an Ids (source-drain current) vs. Vds (source-drain voltage) characteristic of a p-channel transistor. The curve 201 includes a saturation region 202 and a linear region 203. When Vds is equal to a value obtained by subtracting the threshold voltage (Vth) of the transistor from the gate-source voltage (Vgs), that is, Vds=Vgs−Vth (this Vds is called a saturation drain voltage), Vds delimits a boundary between the linear region 203 and the saturation region 202. A dashed line 200 in FIG. 2A is a curve formed by a point which delimits the boundary between the linear region and the saturation region in the curve 201 when Vgs is changed. In other words, an intersection of the dashed line 200 and the curve which shows the Ids vs. Vds characteristic is a boundary point between the linear region and the saturation region.

In the case where the EL element 102 is driven with analog gray-scale displays, the driving transistor 101 is operated in the saturation region 202 in many cases. This is because, in the linear region, dependence on the gate voltage of the drain current is small, so that it is difficult to change the drain current significantly and it is not easy to drive the EL element with multiple gray-scale displays. Furthermore, this is because the dependence of Ids on Vds in the linear region 203 is larger than that in the saturation region 202. Description will be made on this below.

In FIG. 2B, a current-voltage curve (I-V curve) 204 of the EL element 102 is shown in addition to the transistor characteristic shown in FIG. 2A. Reference symbol Vcom denotes a reference potential of the EL element 102. An intersection 206 of the curve 204 and the curve 201 corresponds to an operation point of the EL element 102. In other words, a current Ids corresponding to the intersection 206 flows into the EL element.

Deterioration of the EL element 102 increases the resistance of the EL element 102. Then, the current-voltage curve (I-V curve) of the EL element 102 is changed from the curve 204 to a curve 205. In accordance with this change, the operation point of the EL element 102 is shifted from the intersection 206 to an intersection 207. In the saturation region 202, the dependence of Ids on Vds is small, and therefore the amount of current (Ids) flowing into the EL element 102 is not changed so much even if the I-V curve is changed from the curve 204 to the curve 205 due to the deterioration of the EL element by which the operation point is shifted from the intersection 206 to the intersection 207. On the other hand, in the linear region 203 in which the dependence of Ids on Vds is large, the amount of current (Ids) flowing into the EL element 102 is significantly changed when the EL element 102 deteriorates. Therefore, it is difficult to appreciate reduction in luminance of the EL element 102 when it is driven in the saturation region 202.

However, when the EL element 102 significantly deteriorates, the I-V curve of the EL element 102 is changed from the curve 204 to a curve 208, so that the operation point of the EL element 102 is shifted from the intersection 206 to an intersection 209. The intersection 206 is positioned in the saturation region 202 whereas the intersection 209 is positioned in the linear region 203, and therefore the amount of current which flows into the EL element 102 is largely changed to be reduced by ΔI in FIG. 2B. As a result, the luminance of the EL element is largely changed (FIG. 2B).

Patent Documents 1 and 2 are given as techniques for controlling the luminance of EL elements when the EL elements deteriorate.

In Patent Document 1, a display device has been disclosed in which two driving transistors having different characteristics are connected to an EL element and a means for selecting either one of the two driving transistors is provided so as to suppress the shift of the operation point of the EL element from the saturation region to the linear region due to deterioration of the EL element. For high-gray-level (high-luminance) display, a driving transistor having a capability of conducting high current is selected and a gate voltage of the driving transistor is decreased; and for low-gray-level (low-luminance) display, a driving transistor having a capability of conducting low current is selected.

Disclosed in Patent Document 2 is that a voltage between terminals of one EL element among a plurality of EL elements is detected and a voltage which is applied to a power source line is changed based on the detected voltage so that the luminances of the plurality of EL elements are controlled.

PATENT DOCUMENT

Patent Document 1: Japanese Published Patent Application No. 2004-341368
Patent Document 2: Japanese Published Patent Application No. 2006-47668

SUMMARY OF THE INVENTION

In the technology disclosed in Patent Document 1, the driving transistors having different current supply capabilities are manufactured separately depending on their respective sizes or structures. Thus, the current supply capabilities of the driving transistors are fixed. Consequently, reduction in luminance of an EL element cannot be suppressed when deterioration of the EL element is large. Further, although it is preferable that Vds be lower in considering the reliability of each driving transistor and the operation point of the EL element be positioned in the saturation region as near as possible to the linear region, flexibly setting the operation point of the EL element closer to the linear region in order to decrease Vds is difficult because the current supply capabilities of the driving transistors are fixed. That is, considering the deterioration of the EL element sufficiently, it is necessary that the operation point of the EL element is apart from the linear region as far as possible, which results in an increase in Vds, so that deterioration of the driving transistor is larger. As the driving transistor deteriorates, e.g., as the threshold voltage thereof is increased, the amount of current which flows into the EL element is decreased, in accordance with which the luminance of the EL element decreases.

In the invention disclosed in Patent Document 2, since the current flowing between the terminals of the EL element is detected during the period in which the EL element emits light, the amount of current which flows into the EL element is significantly decreased, so that the luminance decreases.

In view of the foregoing, it is an object of the present invention to provide a technique for controlling the luminance of EL elements without deterioration of driving transistors and without decrease in the amount of current which flows into the EL elements when the EL elements emit light so much.

As described above, considering the reliability of the driving transistor, it is preferable that the voltage Vds which is applied to the driving transistor be low. Therefore, it is preferable that the operation point of the EL element be positioned in the saturation region so as not to be apart from the linear region so much. However, as the operation point of the EL element is set closer to the linear region, the operation point of the EL element is shifted from the saturation region to the linear region more easily as the EL element deteriorates.

As shown in FIG. 3A, when the operation point of the EL element shifts from the intersection 206 to the intersection 209 due to deterioration of the EL element, the source-drain voltage of the transistor is decreased by $\Delta\text{Vds}=\text{Vds}-\text{Vds}'$ whereas the voltage which is applied to the EL element is increased by $\Delta V_{EL}=V_{E'}-V_{EL}$.

By returning the operation point of the EL element to the operation point being before the deterioration of the EL element, the amount of current which flows into the EL element is recovered, thereby returning the luminance of the EL element to the luminance being before the deterioration of the EL element. One method thereof is: a voltage $V_{EL}$ and a voltage $V_{EL'}$ which are applied to the EL element before the deterioration of the EL element and after the deterioration of the EL element, respectively, are monitored, and the power source potential of the EL element (which is a reference potential of the EL element) is increased in the negative or positive direction by the same amount as a potential difference $\Delta V_{EL}$ therebetween. For example, in the case where the EL element is driven using a p-channel transistor, a reference potential Vcom is increased by $\Delta V_{EL}$ or more in the negative direction. Accordingly, the I-V curve of the EL element shown in FIG. 3A can be shifted in parallel in the negative direction with respect to the voltage indicated in the horizontal axis, in accordance with which the operation point of the EL element can shift.

FIG. 3B illustrates an example in which the reference potential of the EL element is increased in the negative direction to return the operation point of the EL element being after the deterioration of the EL element to the saturation region being before the deterioration. In FIG. 3B, a curve of the current-voltage characteristic of the EL element is shifted from a curve 208 to a curve 210. The operation point of the EL element is shifted from the intersection 209 in the linear region to an intersection 211 in the saturation region. A curve of the diode characteristic of the EL element is not simply shifted in parallel when the EL element is deteriorated. Therefore, the operation point of the EL element is not returned to the same point as the operation point being before the deterioration even by increasing the reference potential by $\Delta$ Vcom. However, it is not necessary to return the operation point to the same point as the operation point being before the deterioration; the operation point only have to be returned from the linear region to the saturation region. This is because as long as the operation point of the EL element is returned to the saturation region, the current which flows into the EL element can be recovered to substantially the same amount as the amount of the current being before the deterioration, regardless of the position of the operation point in the saturation region. This means that the tolerance of the change amount of the reference potential is wide and the amount of current which flows into the EL element can be easily controlled.

Another method for recovering the amount of current which flows into the EL element is: the gate-source voltage of the driving transistor is increased, which enables the amount of current which flows into the EL element to be recovered to the amount of current being before the deterioration. However, even when the source-line potential is increased, the operation point of the EL element remains in the linear region, so that the drain current which flows into the driving transistor in the linear region, that is, the current which flows into the EL element depends significantly on the source-drain voltage; therefore, it is difficult to determine the amount of current which flows into the EL element by controlling the source-line potential. Accordingly, it is easier to control the current which flows into the EL element by increasing the reference potential of the EL element.

In view of the above, the potential difference which is applied between electrodes of the EL element before and after the deterioration are detected and the reference potential of the EL element is changed, thereby compensating for the luminance of the EL element.

Structures of embodiments of the present invention will be described below.

One embodiment of the present invention is: the potential difference which is applied between the electrodes of the EL element is detected at the time of light emission of the EL element, so that the luminance of the EL element is compensated. Charge corresponding to the potential difference between the electrodes is accumulated in a storage capacitor, the degree of deterioration of the EL element is calculated based on the charge, and the power source potential or reference potential of the EL element is changed, so that the luminance of the EL element is compensated. After the charge corresponding to the potential difference between the electrodes is accumulated, light emission of the EL element is decayed and the potential difference which is applied between the electrodes of the EL element is detected, or alternatively, at a time of light emission of the EL element, the potential difference is detected; in this manner, the luminance of the EL element is compensated.

A circuit according to one embodiment of the present invention includes a driving transistor, an EL element, and a first transistor. A gate of the driving transistor is electrically connected to a first signal terminal; one of a source and a drain thereof is electrically connected to a first power source terminal; and the other of the source and the drain thereof is electrically connected to one of a source and a drain of the first transistor and one electrode (one of an anode and a cathode) of the EL element. A gate of the first transistor is electrically connected to a second signal terminal; and the other of the source and the drain of the first transistor is electrically connected to a signal detector circuit. The other electrode (the other of the anode and the cathode) of the EL element is electrically connected to a second power source terminal. The first power source terminal and the second power source terminal may be connected to power sources independent of each other; or alternatively, the first power source terminal may be electrically connected to the high potential side (or low potential side) of a power source and the second power source terminal may be electrically connected to the low potential side (or high potential side) of the power source.

The driving transistor is turned on by application of the potential of the first signal terminal to supply the potential of the first power source terminal to the EL element, so that the EL element emits light. The first transistor detects the potential difference or the amount of current between the electrodes of the EL element. In a period in which the EL element emits light, the first transistor is turned on by application of the potential of the second signal terminal, thereby conducting charge corresponding to the potential difference between the electrodes of the EL element to the signal detector circuit through the first transistor as a signal current or a signal potential (Vout). In this manner, the potential difference between the electrodes of the EL element is detected. In view of the change in the detected potential difference of the EL element, the potential of the second power source terminal connected to the other electrode of the EL element is controlled, thereby compensating for the reduction in luminance due to deterioration of the EL element.

A circuit according to one embodiment of the present invention includes a driving transistor, an EL element, a first transistor, a second transistor, and a storage capacitor. A gate of the driving transistor is electrically connected to a first signal terminal; one of a source and a drain thereof is electrically connected to a first power source terminal; and the other of the source and the drain thereof is electrically connected to one of a source and a drain of the first transistor and one electrode of the EL element. A gate of the first transistor is electrically connected to a second signal terminal; and the other of the source and the drain of the first transistor is electrically connected to one electrode of the storage capacitor and one of a source and a drain of the second transistor. The other electrode of the storage capacitor is electrically connected to the other electrode of the EL element and a second power source terminal. A gate of the second transistor is electrically connected to a third signal terminal; and the other of the source and the drain of the second transistor is electrically connected to a signal detector circuit. The first power source terminal and the second power source terminal may be connected to power sources independent from each other; or alternatively, the first power source terminal may be electrically connected to the high potential side (or low potential side) of a power source and the second power source terminal may be electrically connected to the low potential side (or high potential side) of the power source.

The driving transistor is turned on by application of the potential of the first signal terminal to supply the potential of the first power source terminal to the EL element, so that the EL element emits light. In a period in which the EL element emits light, the first transistor is turned on by application of the potential of the second signal terminal, thereby accumulating charge corresponding to the potential difference between the electrodes of the EL element in the storage capacitor. Then, the first transistor is turned off by application of the potential of the second signal terminal, so that the charge accumulated in the storage capacitor is retained. Following this state, the driving transistor is turned off by application of the potential of the first signal terminal to decay light emission of the EL element. After that, the second transistor is turned on by application of the potential of the third signal terminal, thereby conducting the charge accumulated in the storage capacitor to the signal detector circuit through the second transistor as a signal current or a signal potential. Then, in view of the change in the detected potential difference which is applied to the EL element, the potential of the second power source terminal connected to the other electrode of the EL element is controlled, thereby compensating for the reduction in luminance due to deterioration of the EL element. In this structure, the storage capacitor functions as a memory element which retains the potential difference between the electrodes of the EL element, and the potential difference between the electrodes of the EL element can be detected even in the state where the EL element does not emit light. Therefore, without reduction in the luminance at the time of light emission of the EL element, the potential of the second power source terminal connected to the other electrode of the EL element can be controlled in view of the change in the potential difference which is applied to the EL element, thereby compensating for the reduction in luminance due to deterioration of the EL element. Further alternatively, the first transistor and the second transistor can be turned on during the period in which the EL element emits light, thereby detecting the potential difference between the electrodes of the EL element. However, it is necessary to detect the potential difference as fast as possible such that the luminance of the EL element is not adversely affected. Further, it is preferable that the impedance of the detection side of the signal detector circuit is high enough not to change the potential of the electrode of the EL element.

A circuit according to one embodiment of the present invention includes a driving transistor, an EL element, a first transistor, a second transistor, and a storage capacitor. A gate of the driving transistor is electrically connected to a first signal terminal; one of a source and a drain thereof is electrically connected to a first power source terminal; and the other of the source and the drain thereof is electrically connected to one of a source and a drain of the first transistor and one electrode of the EL element. A gate of the first transistor is electrically connected to a second signal terminal; and the other of the source and the drain of the first transistor is electrically connected to one electrode of the storage capacitor and a gate of the second transistor. The other electrode of the storage capacitor is electrically connected to the other electrode of the EL element and a second power source terminal. One of a source and a drain of the second transistor is electrically connected to the first power source terminal; and the other of the source and the drain of the second transistor is electrically connected to a signal detector circuit. The first power source terminal and the second power source terminal may be connected to power sources independent from each other; or alternatively, the first power source terminal may be electrically connected to the high potential side (or low potential side) of a power source and the second power source terminal may be electrically connected to the low potential side (or high potential side) of the power source.

The driving transistor is turned on by application of the potential of the first signal terminal to supply the potential of the first power source terminal to the EL element, so that the EL element emits light. In a period in which the EL element emits light, the first transistor is turned on by application of the potential of the second signal terminal, thereby accumulating charge corresponding to the potential difference between the electrodes of the EL element in the storage capacitor and supplying the potential of one electrode of the EL element to the gate of the second transistor to turn on the second transistor. At this time, the second transistor conducts the potential of one electrode of the EL element which is retained by the storage capacitor to the signal detector circuit while suppressing deterioration (generation of noise). Then, the first transistor is turned off by application of the potential of the second signal terminal, so that the charge accumulated in the storage capacitor is retained. Following this state, the driving transistor is turned off by application of the potential of the first signal terminal to decay light emission of the EL element. With the second transistor, the potential of the one electrode of the EL element is conducted to the signal detector circuit as a signal current or a signal potential. Then, in view of the change in the detected potential difference which is applied to the EL element, the potential of the second power source terminal connected to the other electrode of the EL element is controlled, thereby compensating for the reduction in luminance due to deterioration of the EL element. In this structure, the storage capacitor functions as a memory element which retains the potential difference between the electrodes of the EL element, and the potential difference between the electrodes of the EL element can be detected even in the state where the EL element does not emit light. Therefore, without reduction in the luminance at the time of light emission of the EL element, the potential of the second power source terminal connected to the other electrode of the EL element can be controlled in view of the change in the potential difference which is applied to the EL element, thereby compensating for the reduction in luminance due to deterioration of the EL element. Further alternatively, the first transistor and the second transistor can be turned on during the period in which the EL element emits light, thereby detecting the potential difference between the electrodes of the EL element. However, it is necessary to detect the potential difference as fast as possible such that the luminance of the EL element is not adversely affected. Further, it is preferable that the impedance of the detection side of the signal detector circuit is high enough not to change the potential of the electrode of the EL element.

A circuit according to one embodiment of the present invention includes a driving transistor, an EL element, a first transistor, a second transistor, a third transistor, and a storage capacitor. A gate of the driving transistor is electrically connected to a first signal terminal; one of a source and a drain thereof is electrically connected to a first power source terminal; and the other of the source and the drain thereof is electrically connected to one of a source and a drain of the first transistor and one electrode of the EL element. A gate of the first transistor is electrically connected to a second signal terminal; and the other of the source and the drain of the first transistor is electrically connected to one electrode of the storage capacitor and a gate of the second transistor. The other electrode of the storage capacitor is electrically connected to the other electrode of the EL element and a second power source terminal. One of a source and a drain of the second transistor is electrically connected to the first power source terminal; and the other of the source and the drain of the second transistor is electrically connected to one of a source and a drain of the third transistor. A gate of the third transistor is electrically connected to a third signal terminal, and the other of the source and the drain of the third transistor is electrically connected to a signal detector circuit. The first power source terminal and the second power source terminal may be connected to power sources independent from each other; or alternatively, the first power source terminal may be electrically connected to the high potential side (or low potential side) of a power source and the second power source terminal may be electrically connected to the low potential side (or high potential side) of the power source.

The driving transistor is turned on by application of the potential of the first signal terminal to supply the potential of the first power source terminal to the EL element, so that the EL element emits light. In a period in which the EL element emits light, the first transistor is turned on by application of the potential of the second signal terminal, thereby accumulating charge corresponding to the potential difference between the electrodes of the EL element in the storage capacitor and supplying the potential of one electrode of the EL element to the gate of the second transistor to turn on the second transistor. At this time, the second transistor conducts the potential of one electrode of the EL element which is retained by the storage capacitor to the signal detector circuit while suppressing deterioration (generation of noise). Then, the first transistor is turned off by application of the potential of the second signal terminal, so that the charge accumulated in the storage capacitor is retained. Following this state, the driving transistor is turned off by application of the potential of the first signal terminal to decay light emission of the EL element. Next, the third transistor is turned on by application of the potential of the third signal terminal to conduct the potential of one electrode of the EL element to the signal detector circuit as a signal current or a signal potential. Then, in view of the change in the potential difference between the electrodes of the EL element, which is detected in the signal detector circuit, the potential of the second power source terminal connected to the other electrode of the EL element is controlled, thereby compensating for the reduction in luminance due to deterioration of the EL element. In this structure, the storage capacitor functions as a memory element which retains the potential difference between the electrodes of the EL element, and the potential difference between the electrodes of the EL element can be detected even in the state where the EL element does not emit light. Therefore, without reduction in the luminance at the time of light emission of the EL element, the potential of the second power source terminal connected to the other electrode of the EL element can be controlled in view of the change in the potential difference which is applied to the EL element, thereby compensating for the reduction in luminance due to deterioration of the EL element. Further alternatively, the first transistor and the second transistor can be turned on during the period in which the EL element emits light, thereby detecting the potential difference between the electrodes of the EL element. However, it is necessary to detect the potential difference as fast as possible such that the luminance of the EL element is not adversely affected. Further, it is preferable that the impedance of the detection is high enough not to change the potential of the electrode of the EL element.

An active matrix circuit according to one embodiment of the present invention includes a driving transistor, an EL element, a first transistor, a second transistor, a first storage capacitor, a switching transistor, a second storage capacitor, a first scanning line, a second scanning line, a signal line, and a power source line. A gate of the switching transistor is electrically connected to the first scanning line; one of a source and a drain thereof is electrically connected to the signal line; and the other of the source and the drain thereof is electrically connected to a gate of the driving transistor and one electrode of the second storage capacitor. One of a source and a drain of the driving transistor is electrically connected to the power source line and the other electrode of the second storage capacitor; and the other of the source and the drain thereof is electrically connected to one of a source and a drain of the first transistor and one electrode of the EL element. A gate of the first transistor is electrically connected to the first scanning line; and the other of the source and the drain of the first transistor is electrically connected to one electrode of the first storage capacitor and one of a source and a drain of the second transistor. The other electrode of the first storage capacitor is electrically connected to the other electrode of the EL element and a power source terminal. A gate of the second transistor is electrically connected to the second scanning line; and the other of the source and the drain of the second transistor is electrically connected to a signal detector circuit. The power source line is electrically connected to one of the high potential side and the low potential side of a power source whereas the power source terminal is electrically connected to the other of the low potential side and the high potential side of the power source.

Either the second transistor or the second scanning line is not necessarily provided per pixel but may be provided per row or column of pixels.

The switching transistor is turned on by application of the potential of the first scanning line to supply the potential of the signal line to one electrode of the second storage capacitor and the gate of the driving transistor. The second storage capacitor retains the gate potential of the diving transistor. When the driving transistor is turned on, the potential of the power source line is supplied to the EL element and the EL element emits light. The potential of the first scanning line turns on the switching transistor and the first transistor. During the period in which the first transistor is on, charge corresponding to the potential difference which is applied to the EL element is accumulated in the first storage capacitor. Next, the switching transistor and the first transistor are turned off, so that the charge is retained in the first storage capacitor. Next, the second transistor is turned on by application of the potential of the second scanning line, so that the charge accumulated in the first storage capacitor is conducted through the second transistor to the signal detector circuit as a signal current or a signal potential, whereby the potential difference between the electrodes of the EL element is detected. In view of the change in the detected potential difference which is applied to the EL element, the potential of the power source terminal connected to the other electrode of the EL element is controlled, thereby compensating for the reduction in luminance due to deterioration of the EL element. In this structure, the first storage capacitor functions as a memory element which retains the potential difference between the electrodes of the EL element, and the potential difference between the electrodes of the EL element can be detected even in the state where the EL element does not emit light. Therefore, without reduction in the luminance at the time of light emission of the EL element, the potential of the power source terminal connected to the other electrode of the EL element can be controlled in view of the change in the potential difference which is applied to the EL element, thereby compensating for the reduction in luminance due to deterioration of the EL element. Further alternatively, during the period in which the switching transistor and the first transistor are on where the EL element emits light, the potential difference between the electrodes of the EL element can be detected. However, it is necessary to detect the potential difference as fast as possible such that the luminance of the EL element is not adversely affected.

The switching transistor and the first transistor are controlled by the first scanning line, but may be controlled by different scanning lines.

An active matrix circuit according to one embodiment of the present invention includes a driving transistor, an EL element, a first transistor, a second transistor, a third transistor, a first storage capacitor, a switching transistor, a second storage capacitor, a first scan line, a second scan line, a signal line, and a power source line. A gate of the switching transistor is electrically connected to the first scanning line; one of a source and a drain thereof is electrically connected to the signal line; and the other of the source and the drain thereof is electrically connected to a gate of the driving transistor and one electrode of the second storage capacitor. One of a source and a drain of the driving transistor is electrically connected to the power source line and the other electrode of the second storage capacitor; and the other of the source and the drain thereof is electrically connected to one of a source and a drain of the first transistor and one electrode of the EL element. A gate of the first transistor is electrically connected to the first scanning line; and the other of the source and the drain of the first transistor is electrically connected to one electrode of the first storage capacitor and a gate of the third transistor. The other electrode of the first storage capacitor is electrically connected to the other electrode of the EL element and a power source terminal. One of a source and a drain of the third transistor is electrically connected to the power source line; and the other of the source and the drain of the third transistor is electrically connected to one of a source and a drain of the second transistor. A gate of the second transistor is electrically connected to the second scanning line, and the other of the source and the drain of the second transistor is electrically connected to a signal detector circuit. The power source line is electrically connected to one of the high potential side and the low potential side of a power source whereas the power source terminal is electrically connected to the other of the high potential side and the low potential side of the power source.

Either the second transistor or the second scan line is not necessarily provided per pixel but may be provided per row or column of pixels.

The switching transistor is turned on by application of the potential of the first scan line to supply the potential of the signal line to the second storage capacitor and the gate of the driving transistor. The second storage capacitor retains the gate potential of the diving transistor. When the driving transistor is turned on, the potential of the power source line is supplied to the EL element and the EL element emits light. The potential of the first scanning line turns on the switching transistor and the first transistor. During the period in which the first transistor is on, charge corresponding to the potential difference which is applied to the EL element is accumulated in the first storage capacitor and the potential of one electrode of the EL element is also applied to the gate of the third transistor to turn on the third transistor. At this time, the third transistor conducts the potential difference between the electrodes of the EL element, which is retained by the storage capacitor, to the signal detector circuit while suppressing deterioration (generation of noise). Next, the switching transistor and the first transistor are turned off by application of the potential of the first scanning line, so that the charge is retained in the first storage capacitor. Next, the switching transistor is turned on by application of the potential of the second scanning line, so that the potential of one electrode of the EL element is conducted to the signal detector circuit as a signal current or a signal potential. Then, in view of the detected potential difference between the electrodes of the EL element, the potential of the power source terminal connected to the other electrode of the EL element is controlled, thereby compensating for the reduction in luminance due to deterioration of the EL element. In this structure, the first storage capacitor functions as a memory element which retains the potential difference between the electrodes of the EL element, and the potential difference between the electrodes of the EL element can be detected even in the state where the EL element does not emit light. Therefore, without reduction in the luminance at the time of light emission of the EL element, the potential of the power source terminal connected to the other electrode of the EL element can be controlled in view of the change in the potential difference of the EL element, thereby compensating for the reduction in luminance due to deterioration of the EL element. Further alternatively, during the period in which the switching transistor and the first transistor are on where the EL element emits light, the potential difference between the electrodes of the EL element can be detected. However, it is necessary to detect the potential difference as fast as possible such that the luminance of the EL element is not adversely affected. Further, it is preferable that the impedance of the detection is high enough not to change the potential of the electrode of the EL element.

The switching transistor and the first transistor are controlled by the first scan line, but may be controlled by different scanning lines.

The conductivity types of the driving transistor, the first transistor, the second transistor, the third transistor, and the switching transistor may be individually either an n-type or a p-type.

According to one mode of the present invention, in order to compensate the reduction in luminance due to the deterioration of the EL element, the potential difference between the electrodes of the EL element is detected in the light-emitting period of the EL element, charge corresponding to the potential difference between the electrodes is accumulated in the storage capacitor, the degree of deterioration of the EL element is calculated based on this charge, and the power source potential or the reference potential of the EL element is changed. After the charge corresponding to this potential difference is accumulated in the storage capacitor, the light emission of the EL element may be decayed; or alternatively, the potential difference between the electrodes of the EL element is detected in the period in which the EL element emits light, so that the luminance of the EL element is compensated. In this manner, reduction in luminance due to decrease in the amount of current which flows into the EL element can be prevented. Further, the operation point of the driving transistor which is operated in the saturation region can be shifted to be closer to the linear region, and the voltage which is applied to the driving transistor can be decreased to suppress the deterioration of the characteristics of the driving transistor.

DETAILED DESCRIPTION OF THE INVENTION

Figure 1:
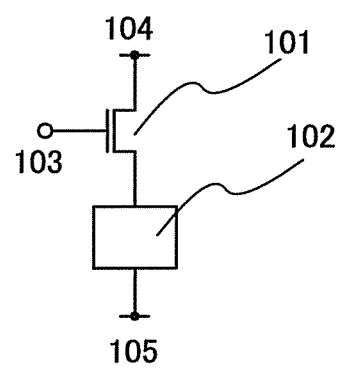
FIG. 1 is a circuit diagram of an EL element.
Figure 2A:
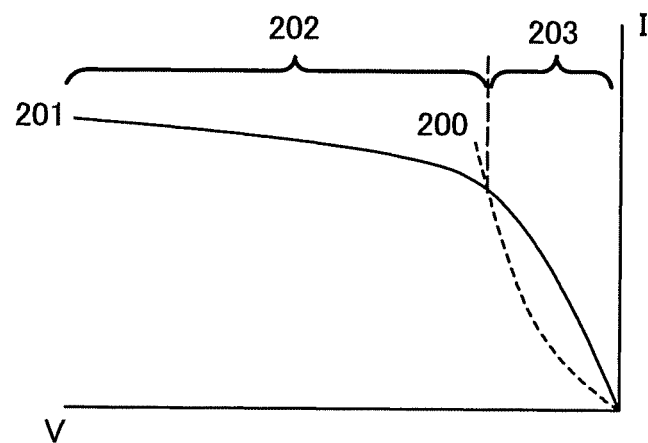
FIGS. 2A and 2B are graphs of characteristic curves.
Figure 2B:
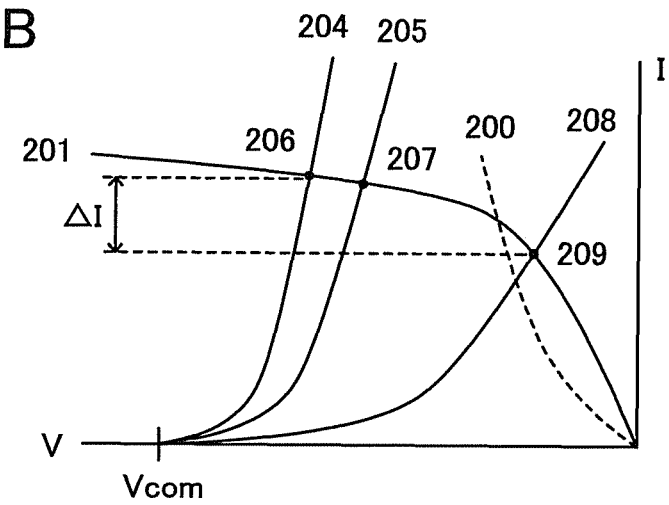

Embodiments of the present invention will be described with reference to the drawings. However, the present invention can be implemented in many different modes other than these, and it is to be easily understood by those skilled in the art that various changes in modes and details thereof can be changed variously without departing from the purpose and scope of the present invention. Therefore, the present invention should not be interpreted as being limited to the description of the embodiments to be given below. Further, the same portions and portions having the same functions are denoted by the same reference numerals through the drawings; and the description will be not repeated in the description hereinbelow.

Embodiment 1

Figure 4A:
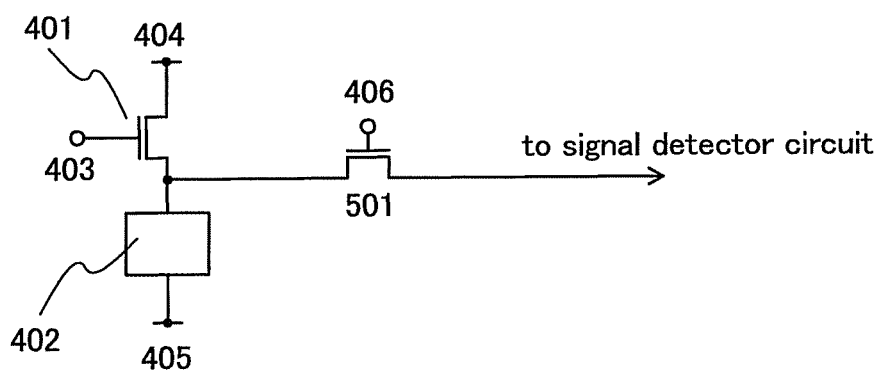
FIGS. 4A and 4B are circuit diagrams of light-emitting devices according to Embodiment 1 of the present invention.

In FIG. 4A, a driving transistor 401, an EL element 402, and a first transistor (SW-1 Tr) 501 are shown. A gate of the driving transistor 401 is electrically connected to a first signal terminal 403. One of a source and a drain of the driving transistor 401 is electrically connected to a first power source terminal 404; and the other of the source and the drain thereof is electrically connected to one electrode (one of an anode and a cathode) of the EL element 402 and one of a source and a drain of the SW-1 Tr 501. A gate of the SW-1 Tr 501 is electrically connected to a second signal terminal 406; and the other of the source and the drain thereof is electrically connected to a signal detector circuit. The other electrode (the other of the anode and the cathode) of the EL element 402 is electrically connected to a second power source terminal 405.

The driving transistor 401 controls the amount of current which flows into the EL element 402 to determine the luminance of the EL element 402. A power source potential (Vdd) is applied to the first power source terminal 404, and a reference potential (Vcom) is applied to the second power source terminal 405.

The SW-1 Tr 501 functions as a switch when the potential of one electrode of the EL element 402 is conducted to the signal detector circuit. The SW-1 Tr 501 is turned on by the potential of the second signal terminal 406, thereby conducting the potential of one electrode (one of the anode and the cathode) of the EL element 402 to the signal detector circuit through the SW-1 Tr 501 as a signal current or a signal potential (Vout). In this manner, the potential difference between the electrodes of the EL element 402 can be detected. In view of the change in the detected potential difference of the EL element 402, the reference potential (Vcom) which is applied to the second power source terminal 405 connected to the other electrode of the EL element 402 is controlled, thereby compensating for the reduction in luminance due to deterioration of the EL element 402.

Figure 5:
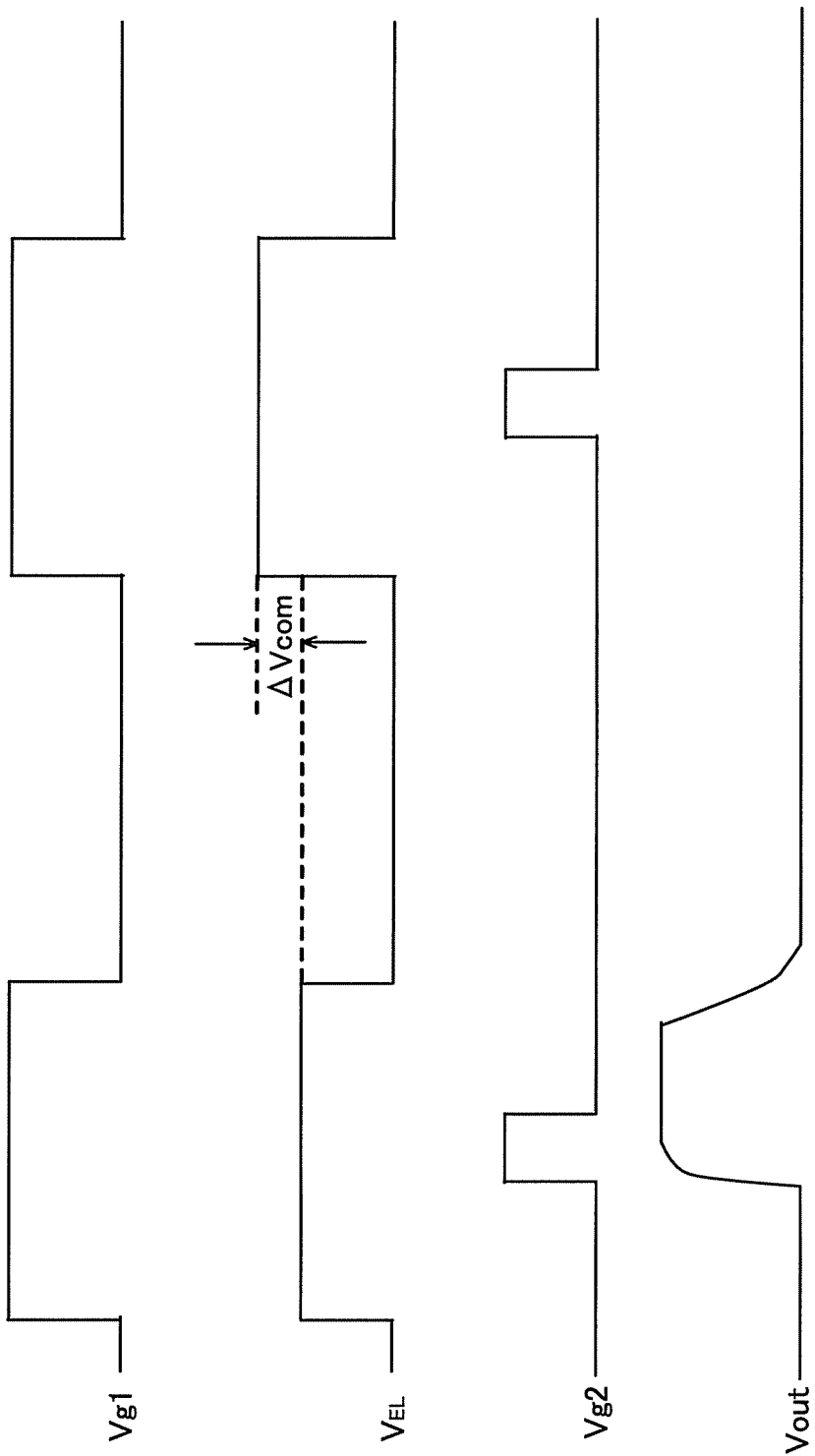
FIG. 5 is a timing chart according to Embodiment 1 of the present invention.

The operation of the circuit shown in FIG. 4A will be described using a timing chart shown in FIG. 5. The driving transistor 401 functions as a switch for supplying current to the EL element 402. A potential Vg1 is conducted to the first signal terminal 403. When Vg1 is higher than the threshold voltage of the driving transistor 401, the driving transistor 401 is turned on to conduct the power source potential Vdd to one electrode of the EL element 402, so that a voltage ($V_{EL}$) which is the potential difference between the power source potential Vdd and the potential of the second power source terminal 405 is applied to the EL element. As a result, the EL element 402 emits light. On the other hand, when Vg1 is lower than the threshold voltage of the driving transistor 401, the driving transistor 401 is turned off not to conduct the power source potential Vdd to the EL element, so that the EL element 402 does not emit light.

Figure 3A:
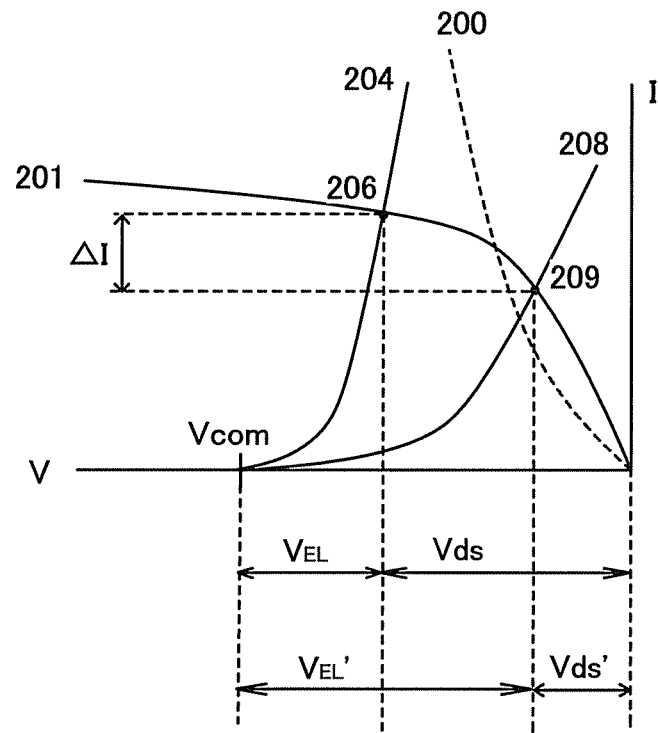
FIGS. 3A and 3B are graphs of characteristic curves.
Figure 3B:
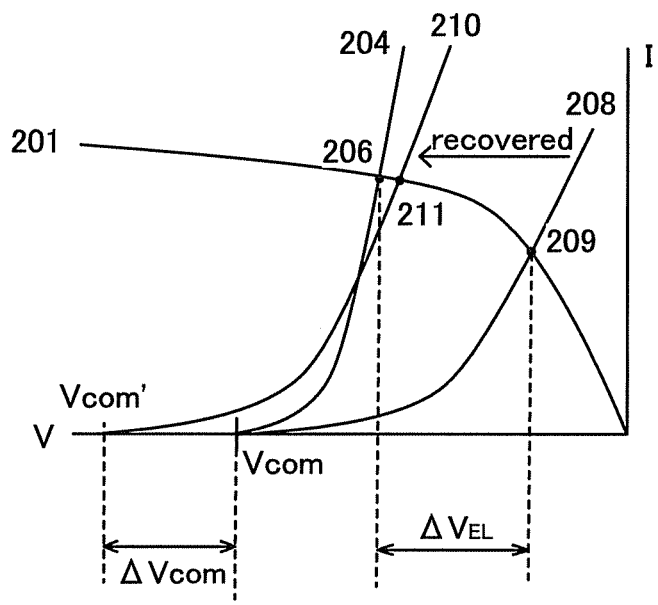

The driving transistor 401 is turned on by application of the potential Vg1 of the first signal line to conduct the potential $V_{EL}$ between the electrodes of the EL element 402, so that the EL element 402 emits light. Next, the SW-1 Tr 501 is turned on by application of a potential Vg2 of the second signal line, thereby conducting the potential of one electrode of the EL element 402 to the signal detector circuit as a signal current or a signal potential (Vout). The SW-1 Tr 501 is turned on only at a time in the period in which the EL element 402 emits light. Note that ON/OFF of the SW-1 Tr 501 can be changed by changing the potential Vg2 of the second signal terminal 406: when Vg2 is higher than the threshold voltage of the SW-1 Tr 501, the SW-1 Tr 501 is turned on whereas when Vg2 is lower than the threshold voltage of the SW-1 Tr 501, the SW-1 Tr 501 is turned off. During the period in which the driving transistor 401 is turned on and the EL element 402 emits light, the SW-1 Tr 501 is turned on. As shown in FIG. 3B, as the EL element deteriorates, the voltage which is applied to the EL element is increased by $\Delta V_{EL} = V_{EL}' - V_{EL}$. The signal detector circuit detects the voltage which is applied to the EL element and $\Delta V_{EL}$ is calculated, and the reference potential of the EL element is increased by $\Delta$Vcom where $\Delta$Vcom$> \Delta V_{EL}$. Accordingly, the amount of current which flows into the EL element can be recovered, so that the luminance of the EL element can be returned to the luminance being before the deterioration of the EL element. In FIG. 5, the state where the voltage which is higher by $\Delta$ Vcom is applied between the electrodes of the EL element at the timing before the EL element emits light next is shown.

The potential difference between the electrodes of the EL element before deterioration, which is a reference value for compensation of the luminance of the EL element, can be detected at any timing as appropriate: for example, at the time when power is on, or for each period of time.

According to this circuit, the voltage which is applied to the EL element 402 can be detected in a part of period in which the driving transistor 401 is turned on, that is, the EL element 402 emits light. Therefore, the voltage which is applied to the EL element 402 can be detected without reduction in the amount of current which flows into the EL element or reduction in the luminance of the EL element.

In the circuit shown in FIG. 4A, the potential difference between the electrodes of the EL element is detected only in the period in which the SW-1 Tr is turned on. However, charge corresponding to the potential difference between the electrodes of the EL element may be accumulated in a storage capacitor (Cs), and then, the accumulated charge may be conducted to the signal detector circuit as a signal current or a signal potential (Vout) (FIG. 4B).

Figure 4B:
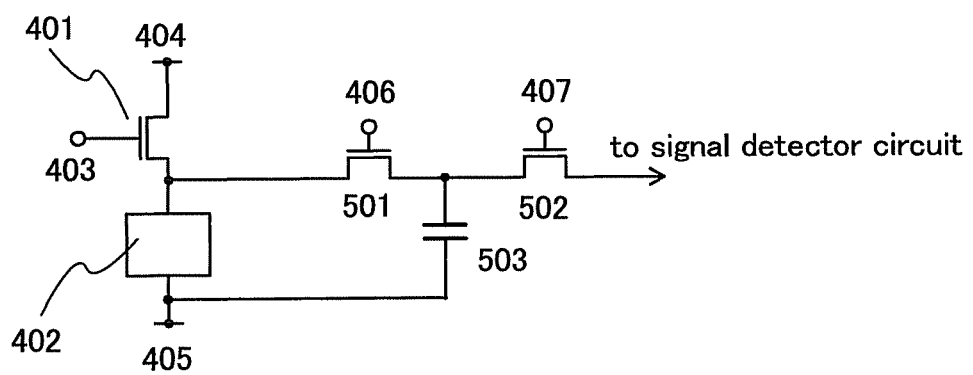

In FIG. 4B, a driving transistor 401, an EL element 402, a SW-1 Tr 501, a second transistor (SW-2 Tr) 502, and a storage capacitor (Cs) 503 are shown. A gate of the driving transistor 401 is electrically connected to a first signal terminal 403. One of a source and a drain of the driving transistor 401 is electrically connected to a first power source terminal 404; and the other of the source and the drain thereof is electrically connected to one electrode of the EL element 402 and one of a source and a drain of the SW-1 Tr 501. A gate of the SW-1 Tr 501 is electrically connected to a second signal terminal 406; and the other of the source and the drain thereof is electrically connected to one electrode of the Cs 503 and one of a source and a drain of the SW-2 Tr 502. The other electrode of the Cs 503 is electrically connected to the other electrode of the EL element 402 and a second power source terminal 405. A gate of the SW-2 Tr 502 is electrically connected to a third signal terminal 407; and the other of the source and the drain of the SW-2 Tr 502 is electrically connected to a signal detector circuit.

The Cs 503 accumulates charge corresponding to the potential difference between the electrodes of the EL element 402. The SW-1 Tr 501 functions as a switch for supplying charge to the Cs 503. The SW-1 Tr 501 is selected (turned on) by the potential of the second signal terminal 406, so that the charge corresponding to the potential difference between the electrodes of the EL element 402 is accumulated in the Cs 503. Next, the SW-1 Tr 501 is turned off by application of the potential of the second signal terminal 406, so that the charge accumulated in the Cs 503 is retained. The Cs 503 functions as a memory element for retaining the potential difference between the electrodes of the EL element 402, and the potential difference between the electrodes of the EL element 402 can be conducted to the signal detector circuit by turning the SW-2 Tr 502 on by application of the potential of the third signal terminal 407 even in the period in which the EL element does not emit light. Therefore, without reduction in the luminance at the time of light emission of the EL element, the potential of the second power source terminal connected to the other electrode of the EL element can be controlled in view of the change in the potential difference which is applied to the EL element, thereby compensating for the reduction in luminance due to deterioration of the EL element. Further alternatively, the SW-1 Tr 501 and the SW-2 Tr 502 can be turned on during the period in which the EL element emits light, thereby detecting the potential difference between the electrodes of the EL element. However, it is necessary to detect the potential difference as fast as possible such that the luminance of the EL element is not adversely affected. Further, it is preferable that the impedance of the detection side of the signal detector circuit is high enough not to change the potential of the electrode of the EL element.

Figure 6:
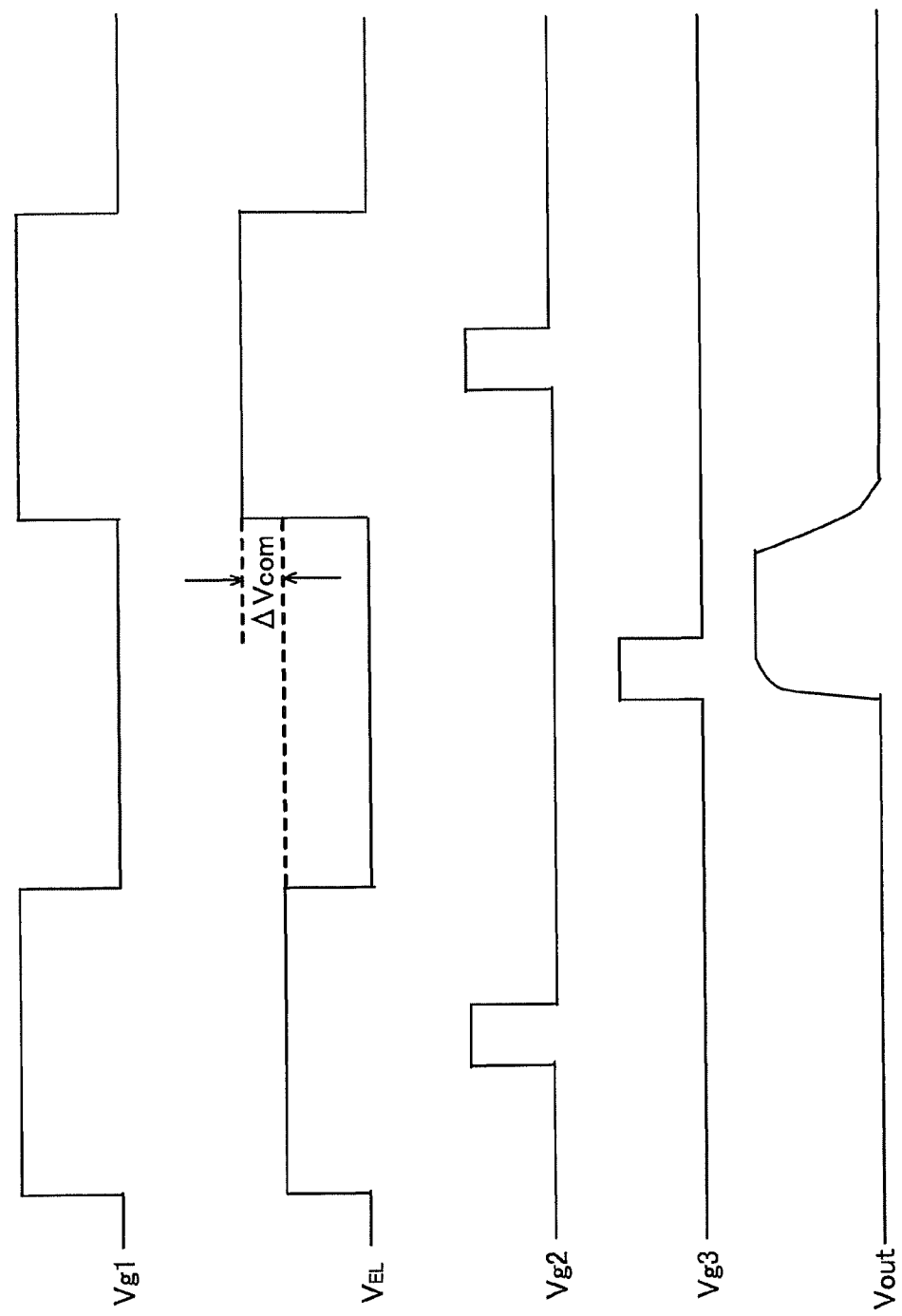
FIG. 6 is a timing chart according to Embodiment 1 of the present invention.

The operation of the circuit shown in FIG. 4B will be described using a timing chart shown in FIG. 6. The driving transistor 401 functions as a switch for supplying current to the EL element 402. A potential Vg1 is conducted to the first signal terminal 403. When Vg1 is higher than the threshold voltage of the driving transistor 401, the driving transistor 401 is turned on to conduct the power source potential Vdd to one electrode of the EL element 402, so that a voltage ($V_{EL}$) which is the potential difference between the power source potential Vdd and the potential of the second power source terminal 405 is applied to the EL element 402. As a result, the EL element 402 emits light. On the other hand, when Vg1 is lower than the threshold voltage of the driving transistor 401, the driving transistor 401 is turned off not to conduct the power source potential Vdd to the EL element 402, so that the EL element 402 does not emit light.

The driving transistor 401 is turned on by application of the potential Vg1 of the first signal line to conduct the potential $V_{EL}$ between the electrodes of the EL element 402, so that the EL element 402 emits light. Next, the SW-1 Tr 501 is turned on by application of a potential Vg2 of the second signal line, so that charge corresponding to the potential difference which is applied to the EL element 402 is accumulated in the Cs 503. After the charge is accumulated in the Cs 503, the SW-1 Tr 501 is turned off, so that the accumulated charge is retained in the Cs 503.

Next, the driving transistor 401 is turned off by application of the potential Vg1 of the first signal line, so that the light emission of the EL element 402 is decayed. After that, the SW-2 Tr 502 is turned on by application of a potential Vg3 of the third signal line, thereby conducting the charge in the Cs 503 to the signal detector circuit as a signal current or a signal potential (Vout). The Cs 503 functions as a memory element for retaining the potential difference between the electrodes of the EL element, and the potential difference between the electrodes of the EL element 402 can be conducted to the signal detector circuit by application of the potential of the third signal terminal 407 even in the period in which the EL element 402 does not emit light. As shown in FIG. 3B, as the EL element deteriorates, the voltage which is applied to the EL element is increased by $\Delta V_{EL} = V_{EL'} - V_{EL}$. The signal detector circuit monitors the voltage which is applied to the EL element and $\Delta V_{EL}$ is calculated, and the reference potential of the EL element is increased by $\Delta$ Vcom where $\Delta$ Vcom > $\Delta V_{EL}$. Accordingly, the amount of current which flows into the EL element can be recovered, so that the luminance of the EL element can be returned to the luminance being before the deterioration of the EL element. In FIG. 6, the state where the voltage which is higher by $\Delta$ Vcom is applied between the electrodes of the EL element at the timing before the EL element emits light next is shown.

The potential difference between the electrodes of the EL element before deterioration, which is a reference value for compensation of the luminance of the EL element, can be detected at any timing as appropriate: for example, at the time when power is on, or for each period of time.

The conductivity types of the driving transistor 401, the SW-1 Tr 501, and the SW-2 Tr 502 are individually either an n-type or a p-type.

According to this circuit, the luminance of the EL element can be compensated without reduction in the current which flows into the EL element or the luminance of the EL element. An input load of the signal detector circuit side does not directly affect the light emission of the EL element, that is, display.

Embodiment 2

In the circuit in FIG. 4B, the gate of the SW-2 Tr 502 is electrically connected to the third signal terminal 407, and the other of the source and the drain of the SW-1 Tr 501 and one electrode of the Cs 503 are electrically connected to one of the source and the drain of the SW-2 Tr 502. The present invention is, however, not limited to this circuit. Without provision of the third signal terminal 407, the other of the source and the drain of the SW-1 Tr 501 and one electrode of the Cs 503 may be electrically connected to the gate of the SW-2 Tr 502, so that a signal corresponding to the potential difference of the electrodes of the EL element is conducted to the signal detector circuit (FIG. 7A).

Figure 7A:
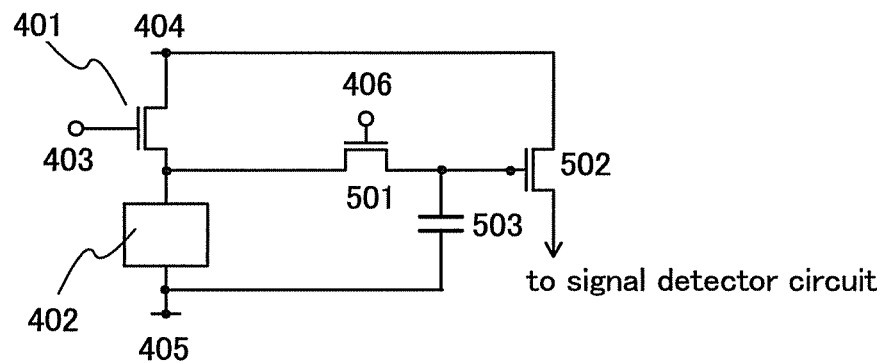
FIGS. 7A and 7B are circuit diagrams of light-emitting devices according to Embodiment 2 of the present invention.

A circuit shown in FIG. 7A includes a driving transistor 401, an EL element 402, a SW-1 Tr 501, a SW-2 Tr 502, and a Cs 503. A gate of the driving transistor 401 is electrically connected to a first signal terminal 403. One of a source and a drain of the driving transistor 401 is electrically connected to a first power source terminal 404; and the other of the source and the drain thereof is electrically connected to one electrode of the EL element 402 and one of a source and a drain of the SW-1 Tr 501. A gate of the SW-1 Tr 501 is electrically connected to a second signal terminal 406; and the other of the source and the drain thereof is electrically connected to one electrode of the Cs 503 and a gate of the SW-2 Tr 502. The other electrode of the Cs 503 is electrically connected to the other electrode of the EL element 402 and a second power source terminal 405. One of a source and a drain of the SW-2 Tr 502 is electrically connected to the first power source terminal 404; and the other of the source and the drain of the SW-2 Tr 502 is electrically connected to a signal detector circuit.

The functions and operations of the driving transistor 401 and the SW-1 Tr 501 are the same as those in Embodiment 1. A power source potential (Vdd) is conducted to the first power source terminal 404, and a reference potential (Vcom) is conducted to the second power source terminal 405.

During the period in which the driving transistor 401 is on and the EL element 402 emits light, the SW-1 Tr 501 is selected (turned on) by application of the potential of the second signal terminal 406, thereby accumulating charge corresponding to the potential difference between the electrodes of the EL element 402 in the Cs 503 and conducting the potential of one electrode of the EL element 402 to the gate of the SW-2 Tr 502 to select the SW-2 Tr 502. Accordingly, the potential difference between the electrodes of the EL element 402 is conducted to the signal detector circuit as a signal current or a signal potential. At this time, the SW-2 Tr 502 conducts the potential of one electrode of the EL element 402 retained by the Cs 503 to the signal detector circuit while suppressing deterioration (generation of noise). In view of the potential difference between the electrodes of the EL element 402, which is detected in the signal detector circuit, the reference potential (Vcom) of the power source terminal connected to the other electrode of the EL element is controlled, thereby compensating for the reduction in luminance due to deterioration of the EL element. In this structure, the Cs 503 functions as a memory element for retaining the potential difference between the electrodes of the EL element: the SW-1 Tr 501 is non-selected (turned off) after charge is accumulated in the Cs 503, thereby retaining the charge accumulated in the Cs 503. Therefore, even in the state where the driving transistor 401 is off and current does not flow into the EL element 402, the potential of one electrode of the EL element which is retained by the Cs 503 can be conducted to the gate of the SW-2 Tr 502; accordingly, the potential difference between the electrodes of the EL element 402 can be detected to compensate for reduction in luminance due to deterioration of the EL element 402 even in the state where current does not flow into the EL element.

According to this circuit, like Embodiment 1, the current which flows into the EL element or the luminance of the EL element is not decreased. An input load of the signal detector circuit side does not directly affect the light emission of the EL element, that is, display. As shown in FIG. 3B, as the EL element deteriorates, the voltage which is applied to the EL element is increased by $\Delta V_{EL} = V_{EL'} - V_{EL}$. The signal detector circuit monitors the voltage which is applied to the EL element and $V_{EL}$ is calculated, and the reference potential of the EL element is increased by $\Delta$ Vcom where $\Delta$ Vcom>$\Delta V_{EL}$. Accordingly, the amount of current which flows into the EL element can be recovered, so that the luminance of the EL element can be returned to the luminance being before the deterioration of the EL element.

Figure 7B:
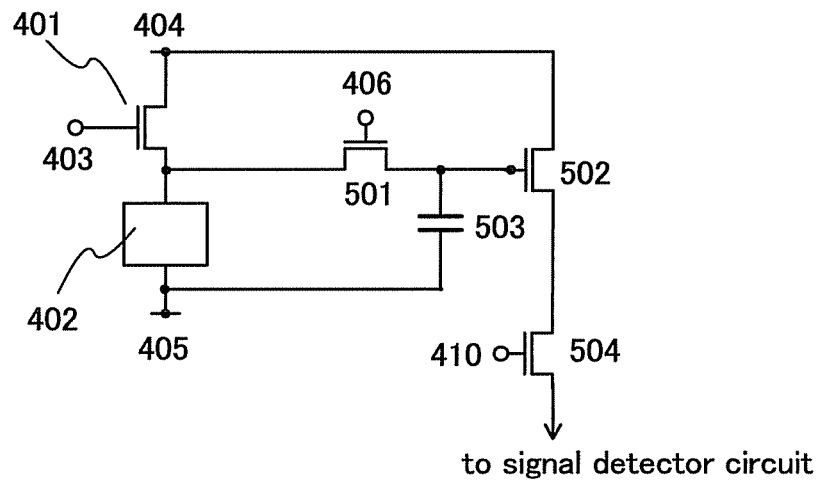

A third transistor (SW-3 Tr) 504 may be provided in the circuit shown in FIG. 7A (FIG. 7B). The SW-3 Tr 504 enables their respective electrode potentials of a plurality of EL elements to be conducted to the signal detector circuit individually as a signal current or a signal potential, so that reduction in luminance due to the deterioration of the plurality of EL elements can be compensated for each EL element.

A circuit shown in FIG. 7B includes a driving transistor 401, an EL element 402, a SW-1 Tr 501, a SW-2 Tr 502, a SW-3 Tr 504, and a Cs 503. Although the other of the source and the drain of the SW-2 Tr 502 is electrically connected to the signal detector circuit in FIG. 7A, the SW-3 Tr 504 is interposed between the other of the source and the drain of the SW-2 Tr 502 and a signal detector circuit in FIG. 7B. One of a source and a drain of the SW-3 Tr 504 is electrically connected to the other of the source and the drain of the SW-2 Tr 502; and the other of the source and the drain of the SW-3 Tr 504 is electrically connected to the signal detector circuit. A gate of the SW-3 Tr 504 is electrically connected to a third signal terminal 410.

During the period in which the driving transistor 401 is on and the EL element 402 emits light, the SW-1 Tr 501 is selected (turned on) by application of the potential of the second signal terminal 406, thereby accumulating charge corresponding to the potential difference between the electrodes of the EL element 402 in the Cs 503 and conducting the potential of one electrode of the EL element 402 to the gate of the SW-2 Tr 502. Then, the SW-3 Tr 504 is selected by application of the potential of the third signal terminal 410, thereby conducting the potential of one electrode of the EL element 402 to the signal detector circuit as a signal current or a signal potential. At this time, the SW-2 Tr 502 conducts the potential of one electrode of the EL element 402 retained by the Cs 503 to the signal detector circuit while suppressing deterioration (generation of noise). Then, in view of the potential difference between the electrodes of the EL element 402, which is detected in the signal detector circuit, the reference potential (Vcom) of the power source terminal connected to the other electrode of the EL element is controlled, thereby compensating for the reduction in luminance due to deterioration of the EL element. In this structure, the Cs 503 functions as a memory element for retaining the potential difference between the electrodes of the EL element: the SW-1 Tr 501 is non-selected (turned off) after charge is accumulated in the Cs 503, thereby retaining the charge accumulated in the Cs 503. Therefore, even in the state where the driving transistor 401 is off and current does not flow into the EL element, the potential of one electrode of the EL element which is retained by the Cs 503 can be conducted to the gate of the SW-2 Tr 502; therefore, the potential of one electrode of the EL element which is retained by the Cs 503 can be conducted to the signal detector circuit as appropriate by turning the SW-3 Tr 504 on. Accordingly, the potential difference between the electrodes of the EL element 402 can be detected to compensate for the reduction in luminance due to deterioration of the EL element 402 even in the state where the driving transistor 401 is off and current does not flow into the EL element 402.

The SW-3 Tr 504 is selected by application of the potential of the third signal terminal 410, so that the potential of one electrode of the EL element 402 retained by the Cs 503 can be conducted to the signal detector circuit. Therefore, their respective electrode potentials of a plurality of EL elements can be conducted to the signal detector circuit individually as a signal current or a signal potential, so that reduction in luminance of the deterioration of the plurality of EL elements can be compensated for each EL element.

Figure 8:
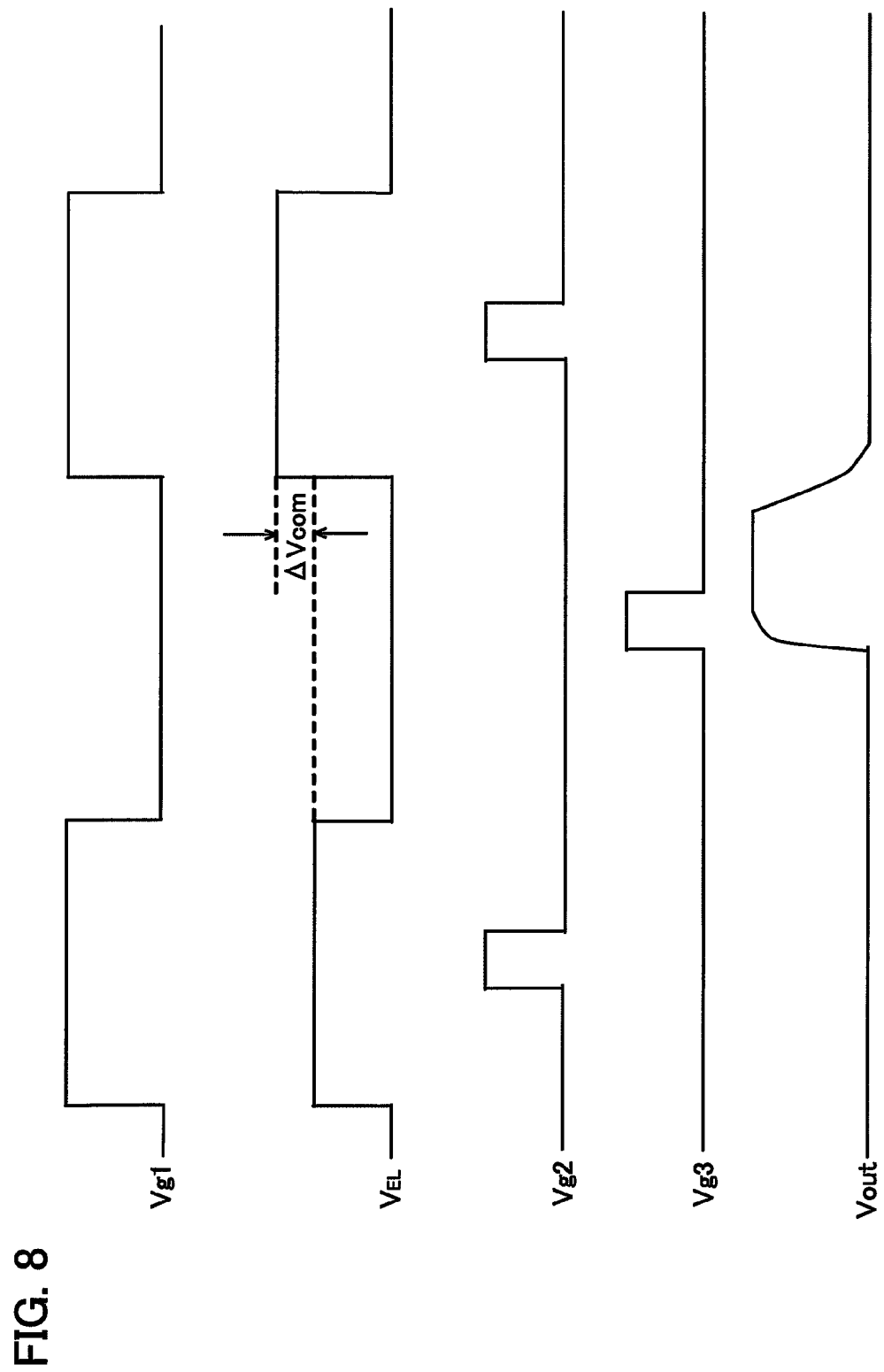
FIG. 8 is a timing chart according to Embodiment 2 of the present invention.

The operation of the circuit shown in FIG. 7B will be described using a timing chart shown in FIG. 8. The driving transistor 401 functions as a switch for conducting current to the EL element 402. A potential Vg1 is conducted to the first signal terminal 403. When Vg1 is higher than the threshold voltage of the driving transistor 401, the driving transistor 401 is turned on, so that the potential difference between the power source potential Vdd and the potential of a second power source terminal which is connected to the EL element is applied to the EL element 402 as a voltage ($V_{EL}$). As a result, the EL element 402 emits light. On the other hand, when Vg1 is lower than the threshold voltage of the driving transistor 401, the driving transistor 401 is turned off not to conduct the power source potential Vdd to the EL element 402, so that the EL element 402 does not emit light.

The driving transistor 401 is turned on by application of the potential Vg1 of the first signal line to conduct the potential difference $V_{EL}$ between the electrodes of the EL element 402, so that the EL element 402 emits light. Next, the SW-1 Tr 501 is turned on by application of the potential of the second signal line, so that charge corresponding to the potential difference which is applied to the EL element 402 is accumulated in the Cs 503 and the potential of one electrode of the EL element 402 is applied to the gate of the SW-2 Tr 502 to turn the SW-2 Tr 502 on. After the charge is accumulated in the Cs 503, the SW-1 Tr 501 is turned off, so that the charge accumulated in the Cs 503 is retained.

Next, the driving transistor 401 is turned off by application of the potential Vg1 of the first signal line, so that the light emission of the EL element 402 is decayed. After that, the SW-3 Tr 504 is turned on by application of a potential Vg3 of the third signal line, thereby conducting the potential of one electrode of the EL element 402 to the signal detector circuit as a signal current or a signal potential (Vout). In this structure, the Cs 503 functions as a memory element for retaining the potential difference between the electrodes of the EL element, and the potential difference between the electrodes of the EL element 402 can be conducted to the signal detector circuit by application of the potential of the third signal terminal 410 even in the period in which the EL element 402 does not emit light. As shown in FIG. 3B, as the EL element deteriorates, the voltage which is applied to the EL element is increased by $\Delta V_{EL} = V_{EL'} - V_{EL}$. The signal detector circuit monitors the voltage which is applied to the EL element and $\Delta V_{EL}$ is calculated, and the reference potential of the EL element is increased by $\Delta$ Vcom where $\Delta$ Vcom>$\Delta V_{EL}$. Accordingly, the amount of current which flows into the EL element can be recovered, so that the luminance of the EL element can be returned to the luminance being before the deterioration of the EL element. In FIG. 8, the state where the voltage which is higher by $\Delta$ Vcom is applied between the electrodes of the EL element at the timing before the EL element emits light next is shown.

The potential difference between the electrodes of the EL element before deterioration, which is a reference value for compensation of the luminance of the EL element, can be detected at any timing as appropriate: for example, at the time when power is on, or for each period of time.

The conductivity types of the driving transistor 401, the SW-1 Tr 501, the SW-2 Tr 502, and the SW-3 Tr 504 are individually either an n-type or a p-type.

According to this circuit, the luminance of the EL element can be compensated without reduction in the current flowing into the EL element or the luminance of the EL element. An input load of the signal detector circuit side does not directly affect the light emission of the EL element, that is, display. Further, by the provision of the SW-3 Tr 504, their respective voltages which are applied to a plurality of EL elements can be detected individually, so that reduction in luminance due to deterioration of the plurality of EL elements can be compensated for each EL element.

Embodiment 3

In this embodiment, the case where the present invention is applied to an active matrix display device in which a plurality of pixels is provided and an EL element is provided for each pixel will be described.

Figure 9:
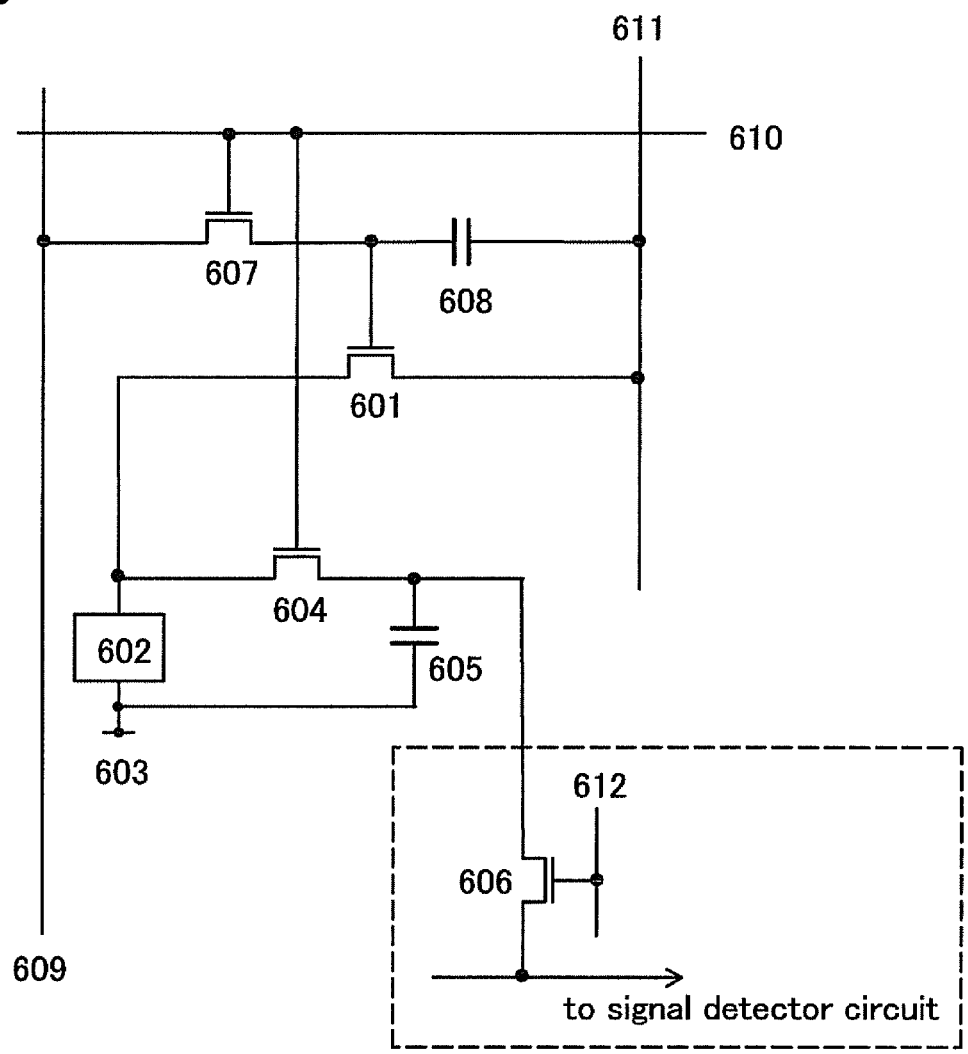
FIG. 9 is a circuit diagram of a light-emitting device according to Embodiment 3 of the present invention.

A circuit shown in FIG. 9 includes a driving transistor 601, an EL element 602, a SW-1 Tr 604, a SW-2 Tr 606, a first storage capacitor Cs 605, a fourth transistor (SW-4 Tr) 607, a second storage capacitor Cs 608, a first scanning line 610, a second scanning line 612, a signal line 609, and a power source line 611. A potential on the high-potential side of a power source (a power source potential, Vdd) is applied to the power source line 611; and a potential on the low-potential side of the power source (a reference potential) is applied to a power source terminal 603, in which the potential corresponds to the reference potential (Vcom) of the EL element 602.

A gate of the SW-4 Tr 607 is electrically connected to the first scanning line 610; one of a source and a drain thereof is electrically connected to the signal line 609; and the other of the source and the drain thereof is electrically connected to a gate of the driving transistor 601 and one electrode of the second storage capacitor Cs 608. One of a source and a drain of the driving transistor 601 is electrically connected to the power source line 611 and the other electrode of the second storage capacitor Cs 608; and the other of the source and the drain thereof is electrically connected to one of a source and a drain of the SW-1 Tr 604 and one electrode of the EL element 602. A gate of the SW-1 Tr 604 is electrically connected to the first scanning line 610; and the other of the source and the drain of SW-1 Tr 604 is electrically connected to one electrode of the first storage capacitor Cs 605 and one of a source and a drain of the SW-2 Tr 606. The other electrode of the first storage capacitor Cs 605 is electrically connected to the other electrode of the EL element 602 and the power source terminal 603. A gate of the SW-2 Tr 606 is electrically connected to the second scanning line 612; and the other of the source and the drain of the SW-2 Tr 606 is electrically connected to a signal detector circuit.

The SW-2 Tr 606 in a circuit surrounded by a dotted line conducts charge accumulated in the first storage capacitor Cs 605 to the signal detector circuit as a signal current or a signal potential. According to this, the potential difference which is applied between the electrodes of the EL element in one pixel can be detected. The reference potential of the EL element is controlled in view of the change in the detected potential difference which is applied between the electrodes of the EL element, thereby compensating the reduction in luminance due to deterioration of the EL element. The circuit surrounded by the dotted line is not necessarily provided per pixel but may be provided per row or column of pixels.

The operation of the circuit shown in FIG. 9 will be described using a timing chart in one frame period, shown in FIG. 10. The SW-4 Tr 607 functions as a switch for conducting the potential of the signal line 609 to the driving transistor 601 and the Cs 608. The driving transistor 601 functions as a switch for conducting current to the EL element 602. Reference symbol Vg1 denotes the potential of the first scanning line 610. When Vg1 is higher than the threshold voltage of the SW-4 Tr 607, the SW-4 Tr 607 is turned on, so that the potential of the signal line 609 is conducted to the gate of the driving transistor 601 (Signal Writing). At the same as this time, the potential of the signal line 609 is also conducted to the other electrode of the second storage capacitor Cs 608. The second storage capacitor Cs 608 retains the gate potential of the driving transistor 601. In the case where the parasitic capacitance between the gate and the source or the gate and the drain of the driving transistor 601 is large, it is not necessary to provide the second storage capacitor Cs 608. When Vg1 is lower than the threshold voltage of the SW-4 Tr 607, the SW-4 Tr 607 is turned off, so that the potential of the signal line 609 (Vsig) is not conducted to the gate of the driving transistor 601. At that time, the potential retained by the second storage capacitor Cs 608 is applied to the gate of the driving transistor 601 (Signal Retaining).

In the case where the potential of the signal line 609 is higher than the threshold voltage of the driving transistor 601, the driving transistor 601 is turned on to conduct the potential of the power source line 611 to one electrode of the EL element 602. As a result, the EL element 602 emits light. On the other hand, in the case where the potential of the signal line 609 is lower than the threshold voltage of the driving transistor 601, the driving transistor 601 is turned off, so that the potential of the power source line 611 is not applied to the EL element 602 and the EL element 602 does not emit light.

The SW-1 Tr 604 and the SW-4 Tr 607 are operated in synchronization with each other and the conductivity types thereof are the same as each other (n-type or p-type). Therefore, the SW-1 Tr 604 is turned on at the time when the SW-4 Tr 607 is turned on, so that charge corresponding to the potential difference applied to the EL element 602 at that time is accumulated in the first storage capacitor Cs 605.

In the holding period, the SW-4 Tr 607 and the SW-1 Tr 604 are turned off by application of the potential of the first scanning line 610. At that time, when the SW-2 Tr 606, which is connected to the first storage capacitor Cs 605, in the circuit surrounded by the dotted line is off, the charge accumulated in the first storage capacitor Cs 605 is retained. That is, the potential which is applied to the EL element 602 in the previous signal-writing period is retained in the first storage capacitor Cs 605. Then, the SW-2 Tr 606 is turned on in the retaining period, so that the charge accumulated in the first storage capacitor Cs 605 can be conducted to the signal detector circuit as a signal current or a signal current. As shown in FIG. 3B, as the EL element deteriorates, the voltage which is applied to the EL element is increased by $\Delta V_{EL} = V'_{EL} - V_{EL}$. The signal detector circuit monitors the voltage which is applied to the EL element and calculates $\Delta V_{EL}$, and the reference potential of the EL element is increased by $\Delta$ Vcom where $\Delta$ Vcom $> \Delta V_{EL}$. Accordingly, the amount of current which flows into the EL element can be recovered, so that the luminance of the EL element can be returned to the luminance being before the deterioration of the EL element. In FIG. 10, the state where the voltage which is higher by $\Delta$ Vcom is applied between the electrodes of the EL element at the timing before the EL element emits light next is shown.

ON/OFF of the SW-2 Tr 606 can be changed by changing the potential Vg2 of the second scanning terminal 612: when Vg2 is higher than the threshold voltage of the SW-2 Tr 606, the SW-2 Tr 606 is turned on whereas when Vg2 is lower than the threshold voltage of the SW-2 Tr 606, the SW-2 Tr 606 is turned off. This circuit configuration enables the voltage which is applied to the EL element 602 to be detected in the retaining period; accordingly, the luminance of the EL element 602 can be compensated without reduction in the current which flows into the EL element 602 or reduction in the luminance of the EL element 602. An input load of the signal detector circuit side does not directly affect the light emission of the EL element, that is, display.

Figure 10:
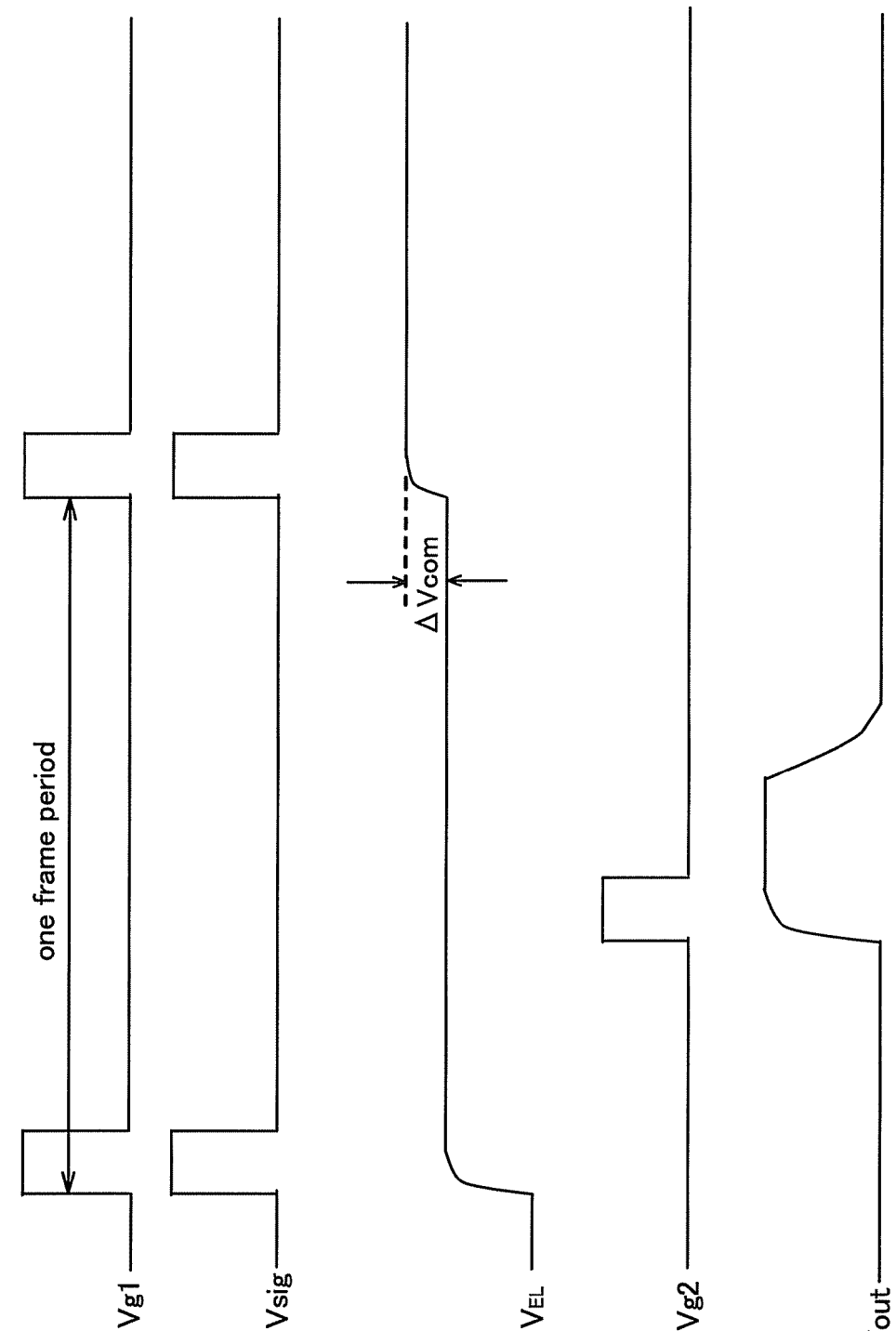
FIG. 10 is a timing chart according to Embodiment 3 of the present invention.
Figure 11:
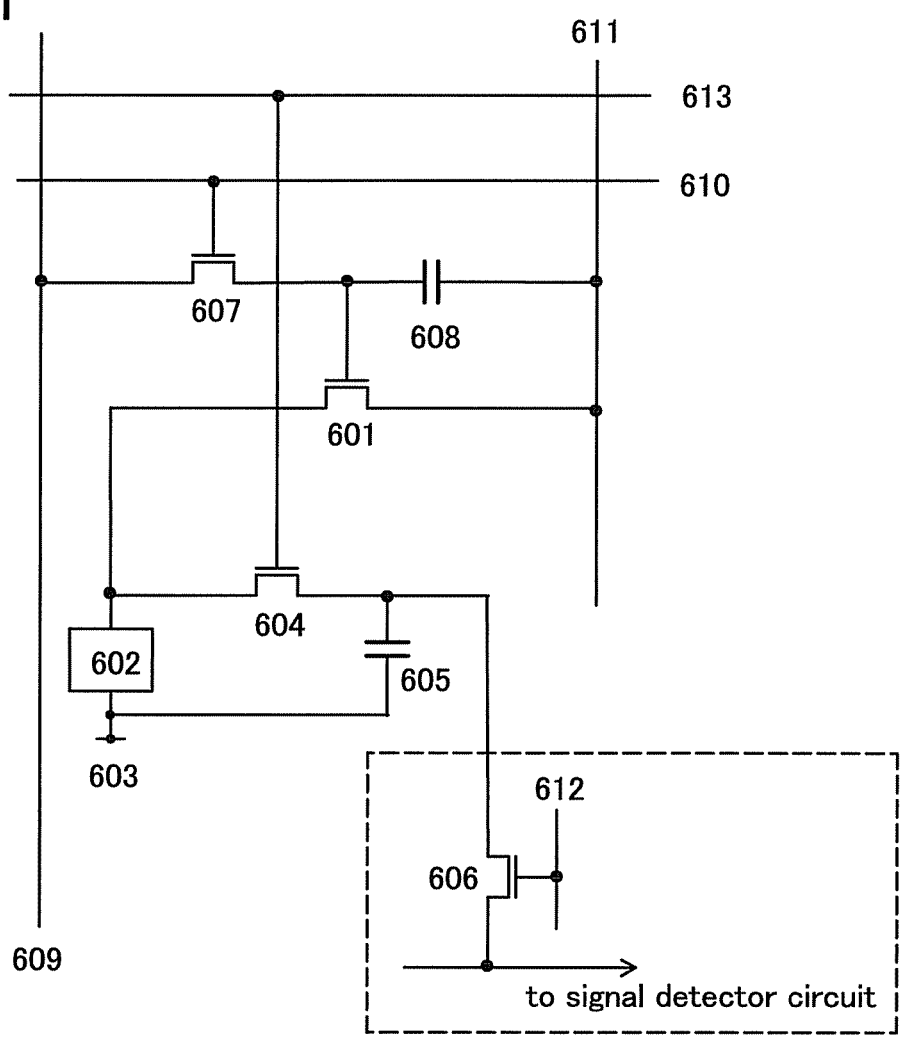
FIG. 11 is a circuit diagram of the light-emitting device according to Embodiment 3 of the present invention.

Although the gate of the SW-1 Tr 604 and the gate of the SW-4 Tr 607 are connected to and controlled by the first scanning line in FIG. 10, they may be controlled by different scanning lines (FIG. 11).

In a circuit shown in FIG. 11, a gate of a SW-1 Tr 604 is electrically connected to and controlled by a third scanning line 613, and a gate of a SW-4 Tr 607 is electrically connected to and controlled by a first scanning line 610. Accordingly, the period in which the SW-1 Tr 604 is on can be set as appropriate in the period in which an EL element 602 emits light. Further, the conductivity types of the SW-1 Tr 604 and the SW-4 Tr 607 may be different from each other.

The potential difference between the electrodes of the EL element before deterioration, which is a reference value for compensation of luminance of the EL element, can be detected at any timing as appropriate: for example, at the time when power is on, or for each period of time.

Embodiment 4

In the circuit according to Embodiment 3, the charge accumulated in the first storage capacitor is conducted to the signal detector circuit as a signal current or a signal potential through the second transistor. The potential retained in the first storage capacitor may be conducted to the signal detector circuit through a third transistor (FIG. 12).

Figure 12:
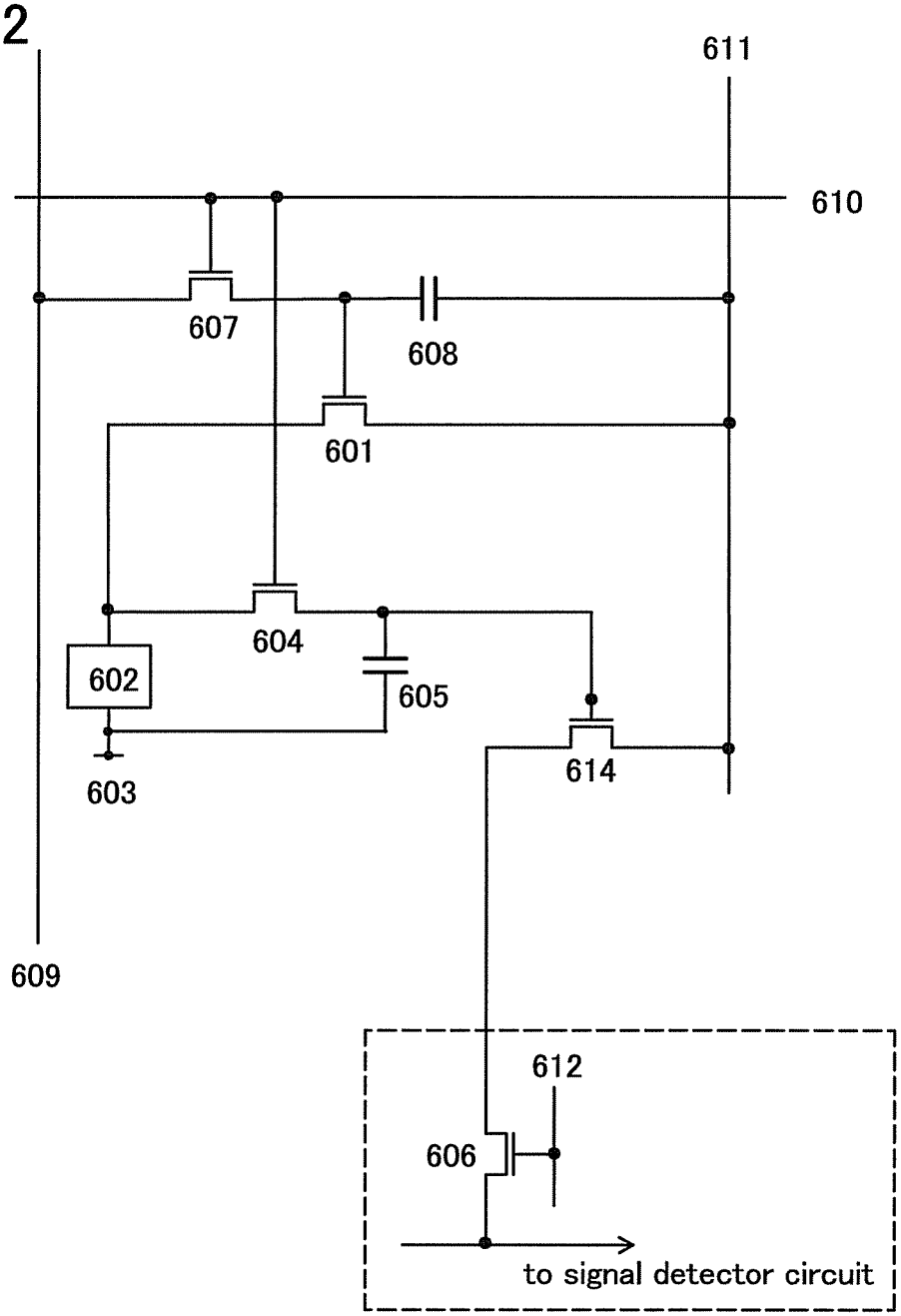
FIG. 12 is a circuit diagram of a light-emitting device according to Embodiment 4 of the present invention.

A circuit shown in FIG. 12 includes a driving transistor 601, an EL element 602, a SW-1 Tr 604, a SW-2 Tr 606, a SW-3 Tr 614, a first storage capacitor Cs 605, a SW-4 Tr 607, a second storage capacitor Cs 608, a first scanning line 610, a second scanning line 612, a signal line 609, and a power source line 611. A potential on the high-potential side of a power source (a power source potential, Vdd) is applied to the power source line 611; and a potential on the low-potential side of the power source (a reference potential) is applied to a power source terminal 603, in which the potential corresponds to the reference potential (Vcom) of the EL element 602.

A gate of the SW-4 Tr 607 is electrically connected to the first scanning line 610; one of a source and a drain thereof is electrically connected to the signal line 609; and the other of the source and the drain thereof is electrically connected to a gate of the driving transistor 601 and one electrode of the second storage capacitor Cs 608. One of a source and a drain of the driving transistor 601 is electrically connected to the power source line 611 and the other electrode of the second storage capacitor Cs 608; and the other of the source and the drain thereof is electrically connected to one of a source and a drain of the SW-1 Tr 604 and one electrode of the EL element 602. A gate of the SW-1 Tr 604 is electrically connected to the first scanning line 610; and the other of the source and the drain of SW-1 Tr 604 is electrically connected to one electrode of the first storage capacitor Cs 605 and a gate of the SW-3 Tr 614. The other electrode of the first storage capacitor Cs 605 is electrically connected to the other electrode of the EL element 602 and the power source terminal 603. One of a source and a drain of the SW-3 Tr 614 is electrically connected to the power source line 611; and the other of the source and the drain thereof is electrically connected to one of a source and a drain of the SW-2 Tr 606. A gate of the SW-2 Tr 606 is electrically connected to the second scan line 612; and the other of the source and the drain thereof is electrically connected to a signal detector circuit.

In the circuit shown in FIG. 12, the SW-3 Tr 614 which conducts the potential of one electrode of the first storage capacitor Cs 605 or the potential of one electrode of the EL element 602 while suppressing deterioration (generation of noise) is provided. When the SW-1 Tr 604 is on, charge corresponding to the potential difference of the EL element 602 is accumulated in the first storage capacitor Cs 605. In addition, the potential of one electrode of the EL element 602 is also conducted to the gate of the SW-3 Tr 614. Next, the SW-1 Tr 604 is turned off by application of the potential of the first scanning line 610, that is, the retaining period is started, so that the charge accumulated in the first storage capacitor Cs 605 can be retained.

Next, the SW-2 Tr 606 is turned on, so that the potential of one electrode of the first storage capacitor Cs 605 can be conducted to the signal detector circuit in the retaining period. Accordingly, the reference potential (Vcom) of the power source terminal 603 connected to the EL element 602 can be controlled in view of the change in the detected potential difference of the EL element 602, so that the reduction in luminance due to deterioration of the EL element can be compensated without reduction in the current which flows into the EL element or reduction in the luminance of the EL element. An input load of the signal detector circuit side does not directly affect the light emission of the EL element, that is, display.

Note that a circuit which has a similar function to or the same function as the SW-3 Tr 614 may be provided on the signal detection circuit side in common with pixels; however, as compared with that case, the noise of signals can be reduced by amplifying each signal for each pixel before conducting to the signal detector circuit.

The conductivity type of the SW-3 Tr 614 is n-type when the potential of the power source line 611 is positive, and is p-type when the potential of the power source line 611 is negative. In this manner, the SW-3 Tr 614 can be used as a source follower for amplification.

Figure 13:
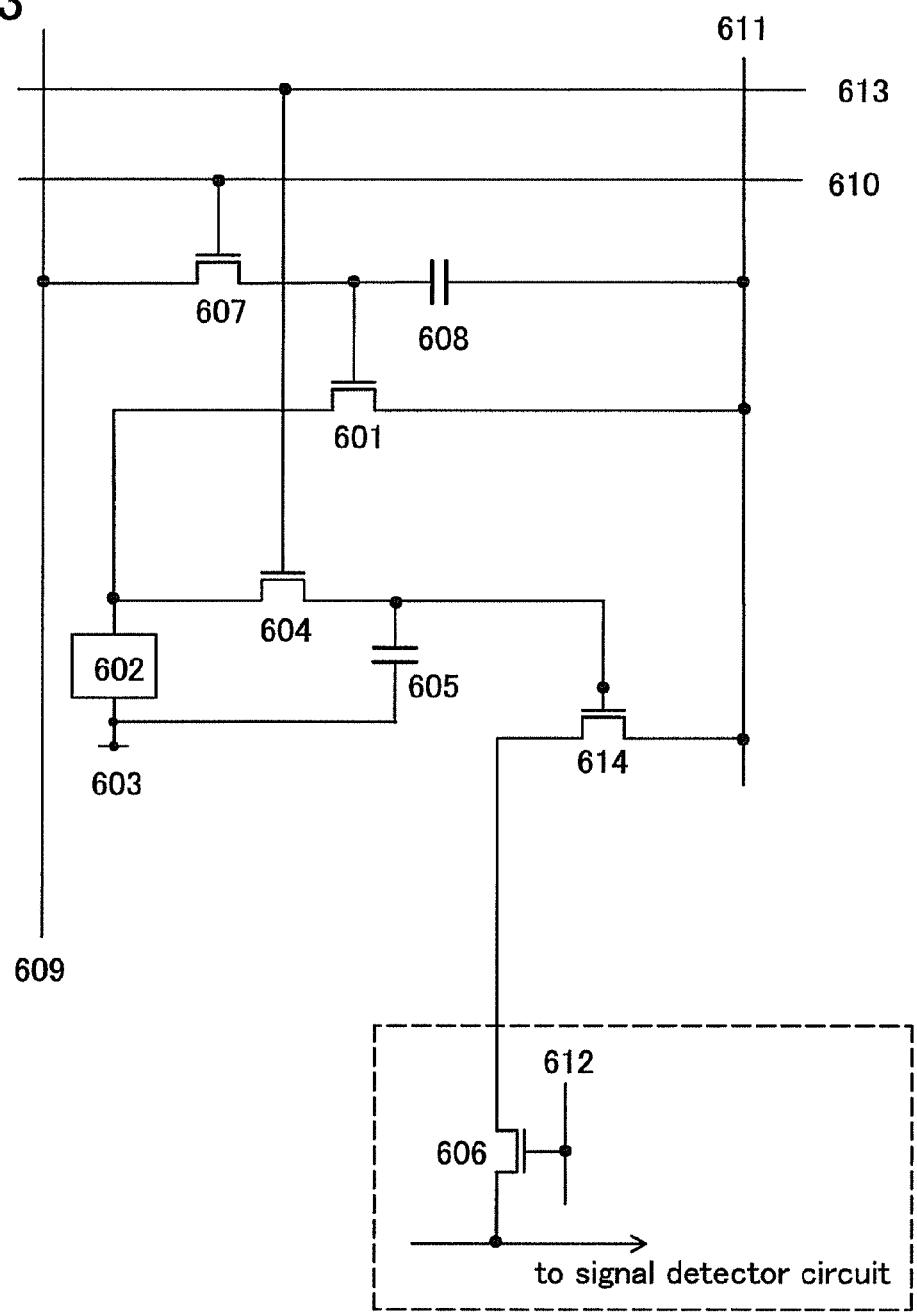
FIG. 13 is a circuit diagram of the light-emitting device according to Embodiment 4 of the present invention.

Although the gate of the SW-1 Tr 604 and the gate of the SW-4 Tr 607 are electrically connected to and controlled by the first scanning line in the circuit shown in FIG. 12, they may be controlled by different scanning lines (FIG. 13).

In a circuit shown in FIG. 13, a gate of a SW-1 Tr 604 is electrically connected to and controlled by a third scanning line 613, and a gate of a SW-4 Tr 607 is electrically connected to and controlled by a first scanning line 610. Accordingly, the period in which the SW-1 Tr 604 is on can be set as appropriate in the period in which an EL element 602 emits light. Further, the conductivity types of the SW-1 Tr 604 and the SW-4 Tr 607 may be different from each other.

The potential difference between the electrodes of the EL element before deterioration, which is a reference value for compensation of the luminance of the EL element, can be detected at any timing as appropriate: for example, at the time when power is on, or for each period of time.

Embodiment 5

Figure 14:
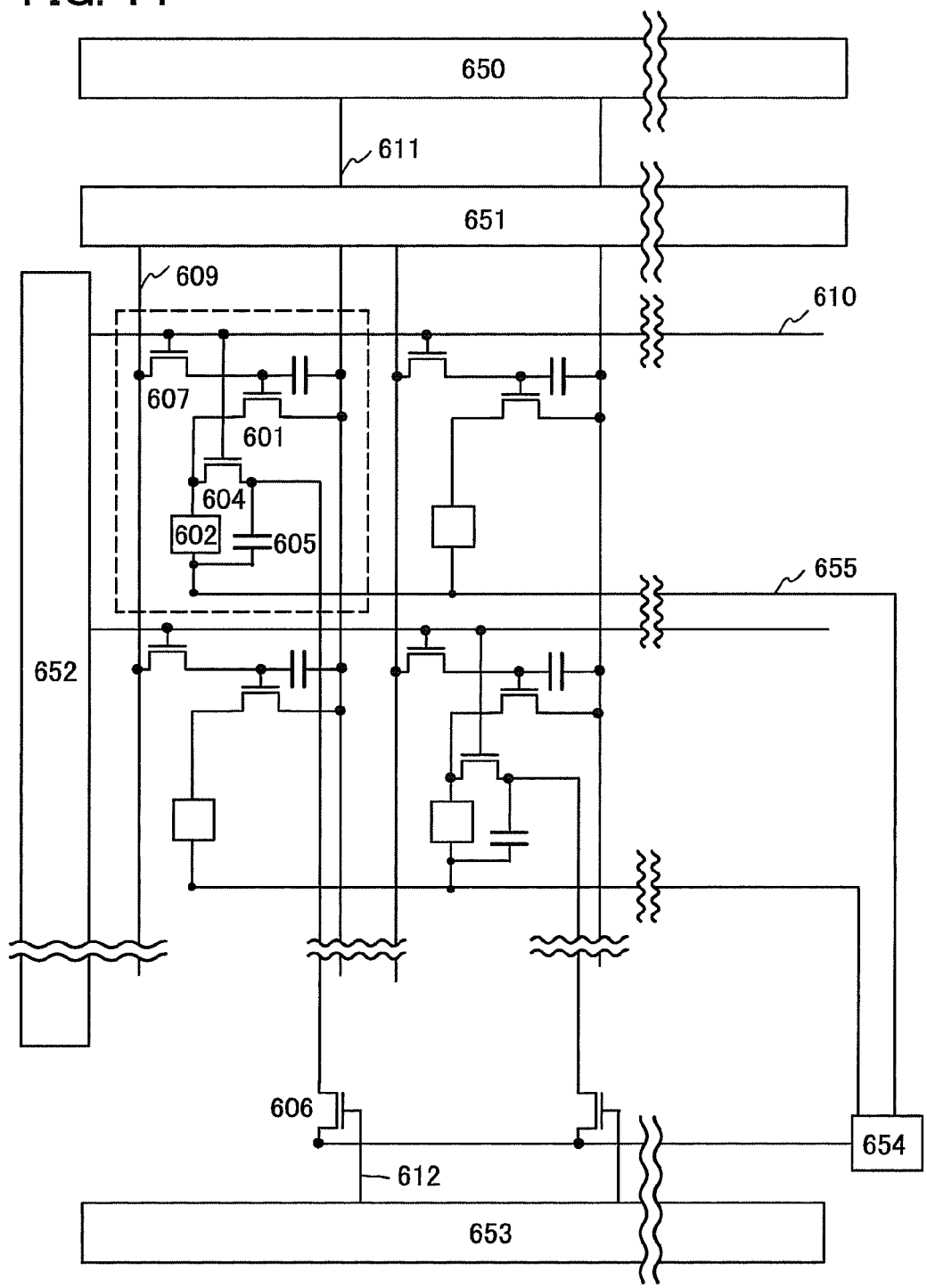
FIG. 14 is a circuit diagram of a light-emitting device according to Embodiment 5 of the present invention.

An active matrix circuit using the circuit shown in FIG. 9 is shown in FIG. 14. The active matrix circuit shown in FIG. 14 includes a first scanning line driver circuit 652 for selecting the switching transistor (SW-4 Tr) 607, a signal line driver circuit 651 for controlling the potential of the signal line 609, a second scanning line driver circuit 653 for selecting the SW-2 Tr 606, a power source circuit 650, and a signal detector circuit 654. The signal detector circuit 654 controls the potential of a second power source line 655 connected to the EL element 602 in view of the change in the detected potential difference of the EL element, thereby compensating for the reduction in luminance due to deterioration of the EL element. In this circuit, the second power source terminals of a plurality of EL elements are connected to the second power source line 655 as a common line. Therefore, FIG. 14 illustrates an example of a circuit in which the potential of the power source line can be changed for each row. A portion surrounded by a dotted line corresponds to one pixel.

The circuit shown in FIG. 9 is incorporated in each of a plurality of pixels, the potential difference of the EL element 602 is detected from each pixel as appropriate, and the potential of the second power source line 655, that is, the reference potential (Vcom) of the EL element 602 is controlled. Note that the provision of power source lines 611 is not limited to that shown in FIG. 14: the power source lines 611 may be each provided per row or a plurality of power source lines may be provided in common with each other. By providing a plurality of circuits each for detecting the potential difference of an EL element such as the circuits shown in FIG. 9, 10, 11, 12, or 13, in a matrix, distribution of the potential difference of a plurality of EL elements can be detected. Their respective reference potentials of the plurality of EL elements are controlled in view of the potential difference, thereby compensating for the variation of the luminance within a panel.

The circuit for detecting the potential difference of an EL element such as the circuit shown in FIG. 9, 10, 11, 12, or 13 may be provided for every pixel.

When the reference potential of the EL element is compensated based on the detected potential difference, the compensation value may be determined in accordance with the value of the worst-deteriorated EL element. Alternatively, compensation values of a plurality of EL elements may be averaged, and the reference potential of each EL element may be compensated based on the average value. In the case where compensation is performed in accordance with the compensation value of the worst-deteriorated EL element, driving of the EL elements of all the pixels can be surely returned to driving in the saturation region whereas the power consumption is increased. On the other hand, in the case where the compensation values of all the pixels are determined in accordance with the average value of their respective compensation values of a plurality of EL elements, driving of the EL elements of all the pixels cannot be returned to driving in the saturation region whereas rise in the power consumption can be suppressed. The compensation value of the reference potential can be determined in accordance with the standard needed for panel display.

With the use of the circuit for compensating the driving voltage of an EL element, according to the present invention, the driving operation point shifted due to deterioration of the EL element can be returned to an operation point being before the deterioration, thereby compensating for the reduction in luminance due to the deterioration of an EL element. Furthermore, an operation point of the EL element in the saturation region can be set near the linear region as much as possible. In this manner, the source-drain voltage which is applied to a driving transistor is decreased, so that the reliability of the driving transistor can be improved. In addition, the luminance of the EL element can be retained.

The present invention is different from the case where a pixel for monitoring an EL element is provided in or around a display pixel; therefore, it is not necessary to provide a pixel which does not contribute toward displaying. Further, since compensation is not performed based on a pixel which does not contribute toward displaying but is performed based on a pixel which contributes toward displaying, luminance compensation of EL elements can be performed with high accuracy.

Embodiment 6

Figure 15:
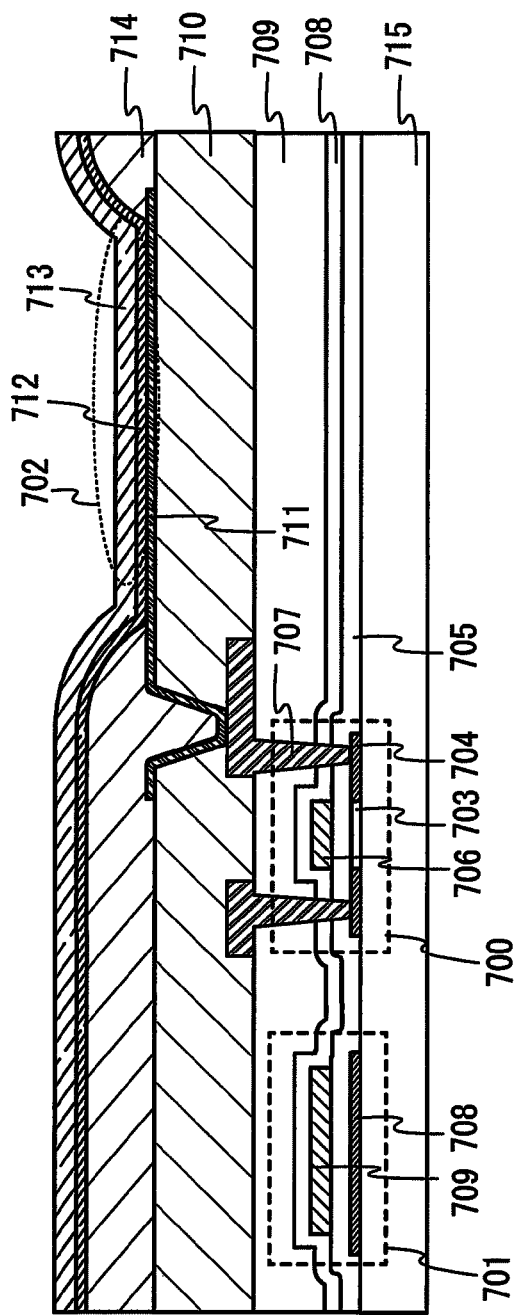
FIG. 15 is a cross-sectional view of a light-emitting device according to Embodiment 6 of the present invention.

A cross-sectional view of a light-emitting device of the present invention is shown in FIG. 15, in which typically, a first transistor 700, a storage capacitor 701, and an EL element 702 are shown.

Although a top-gate thin film transistor is shown in FIG. 15, either a bottom-gate thin film transistor (TFT) or a top-gate thin film transistor (TFT) can be used as each of a driving transistor, a first transistor, a second transistor, a third transistor, and a fourth transistor.

A semiconductor layer 703 of the TFT can be formed using an inorganic semiconductor such as: a semiconductor such as Si, a compound semiconductor such as SiGe or GaAs, or an oxide semiconductor such as ZnO. The inorganic semiconductor may be any of amorphous, microcrystalline, or single-crystalline. Alternatively, an organic semiconductor such as pentacene or oligothiophene can be used. The semiconductor layer 703 is formed by a CVD method, a sputtering method, or the like. Further, in the case where an amorphous semiconductor film is crystallized, a laser crystallization method, a heat crystallization method, or the like can be used.

The TFT is either an n-channel TFT or a p-channel TFT. An impurity region 704 is either an n-type impurity region or a p-type impurity region. Addition of the impurity thereof can be performed by an ion-doping method or the like.

A gate insulating film 705 can be formed using an insulating film such as a silicon oxide film ($SiO_2$), a silicon oxynitride film (SiON), a silicon nitride oxide film (SiNO), a silicon nitride film (SiN), an aluminum oxide film ($Al_2O_3$), or a barium titanate film ($BaTiO_3$). A high-dielectric-constant insulating film such as a hafnium silicon oxynitride film (HfSiON) or an yttrium oxide film ($Y_2O_3$) may be used as well. The gate insulating film 705 can be formed by a thermal oxidation method, a plasma oxidation method, a CVD method, or a sputtering method.

A gate electrode 706, an electrode such as a source electrode 707 or a drain electrode 707, and a wiring such as a scanning line and a signal line can be formed using a single-layer film of tungsten, aluminum, titanium, or tantalum, or a stack-layer film thereof. Each electrode and each wiring can be formed as follows: a metal film is formed by a sputtering method and processed by an etching method. Alternatively, a metal nano paste of silver, gold, or the like can be formed by a droplet-discharge method.

The storage capacitor 701 can be formed including one electrode 708 which is a semiconductor layer in which an n-type or p-type impurity which is the same as the impurity type as the TFT is added, the other electrode 709 which is formed of the same layer as the gate electrode, and the gate insulating film 705. The other electrode 709 of the storage capacitor 701 is electrically connected to the other electrode 713 of the EL element (not shown).

As an insulating film 710 for covering the TFT and the storage capacitor, an inorganic insulating film such as a silicon oxide film or a silicon nitride film or an organic insulating film of an acrylic resin can be used. The inorganic insulating film can be formed by a CVD method or a sputtering method, and the organic insulating film can be formed by a spin-coating method.

The EL element 702 includes one electrode 711, a light-emitting layer 712, and the other electrode 713. Either an organic EL element or an inorganic EL element can be used.

In the case of an organic EL element, a fluorescence emission material or a phosphorescence emission material can be used. As the light emission material, either a low-polymer material or a high-polymer material can be used.

As the light-emitting layer 712, a hole-injecting layer, a hole-transporting layer, an electron-transporting layer, and/or an electron-injecting layer are/is provided as appropriate. A light emission material may be doped into a host material.

In the case of an inorganic EL element, a semiconductor such as ZnO, $Mg_xZn_{1-x}O$, ZnS, ZnTe, or CdS can be used.

The light-emitting layer is formed by a vapor deposition method, a spin-coating method, a droplet-discharge method, or the like.

As each of the electrodes 711 and 713, a metal film or a transparent conductive film of Al, Ti, Mo, Ag, Pt, W, indium tin oxide (ITO), or the like can be used. In that case, a single-layer film or a stack-layer film thereof can be used. A sputtering method, a vapor deposition method, or the like is used.

A bank 714 may be formed using an insulating film.

As a substrate 715, glass, plastics, paper, or the like can be used.

Embodiment 7

There are various applications of the light-emitting device of the present invention. In this embodiment, examples of an electronic device to which the present invention can be applied will be described.

As such an electronic device, a personal digital assistance (such as an electronic notebook, a mobile computer, and a mobile phone), a video camera, a digital camera, a personal computer, a television, and the like can be given. Examples of these are illustrated in FIGS. 16A to 16F.

Figure 16A:
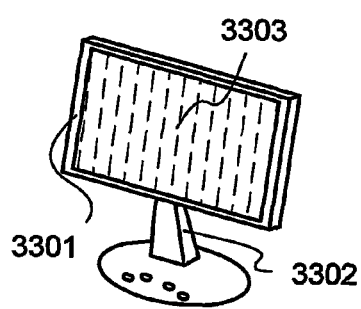
FIGS. 16A to 16F are views each illustrating an example of an electronic apparatus according to Embodiment 7 of the present invention.

FIG. 16A illustrates an EL display, which includes a housing 3301, a support 3302, a display portion 3303, and the like. The light-emitting device of the present invention can be used in the display portion 3303.

Figure 16B:
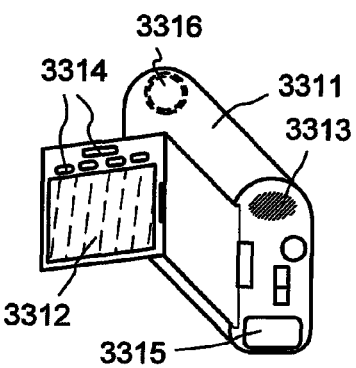

FIG. 16B illustrates a video camera, which includes a main body 3311, a display portion 3312, a sound input portion 3313, operation switches 3314, a battery 3315, an image receiving portion 3316, and the like. The light-emitting device of the present invention can be used in the display portion 3312.

Figure 16C:
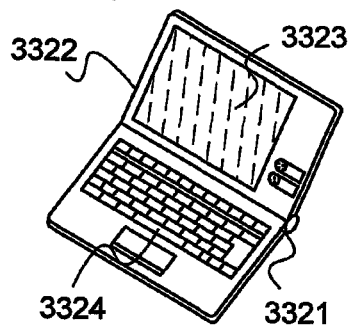

FIG. 16C illustrates a personal computer, which includes a main body 3321, a housing 3322, a display portion 3323, a keyboard 3324, and the like. The light-emitting device of the present invention can be used in the display portion 3323.

Figure 16D:
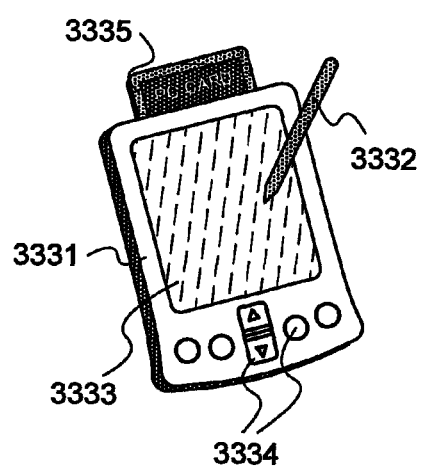

FIG. 16D illustrates a personal digital assistance, which includes a main body 3331, a stylus 3332, a display portion 3333, operation buttons 3334, an outside interface 3335, and the like. The light-emitting device of the present invention can be used in the display portion 3333.

Figure 16E:
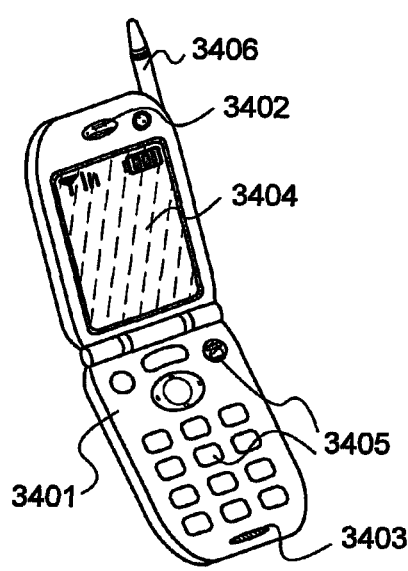

FIG. 16E illustrates a mobile phone, which includes a main body 3401, a sound output portion 3402, a sound input portion 3403, a display portion 3404, operation switches 3405, an antenna 3406, and the like. The light-emitting device of the present invention can be used in the display portion 3404.

Figure 16F:
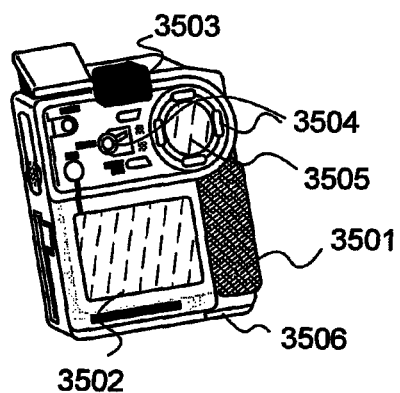

FIG. 16F illustrates a digital camera, which includes a main body 3501, a display portion (A) 3502, an eyepiece 3503, operation switches 3504, a display portion (13) 3505, and a battery 3506. The light-emitting device of the present invention can be used in the display portion (A) 3502 and the display portion (13) 3505.

Figure 17:
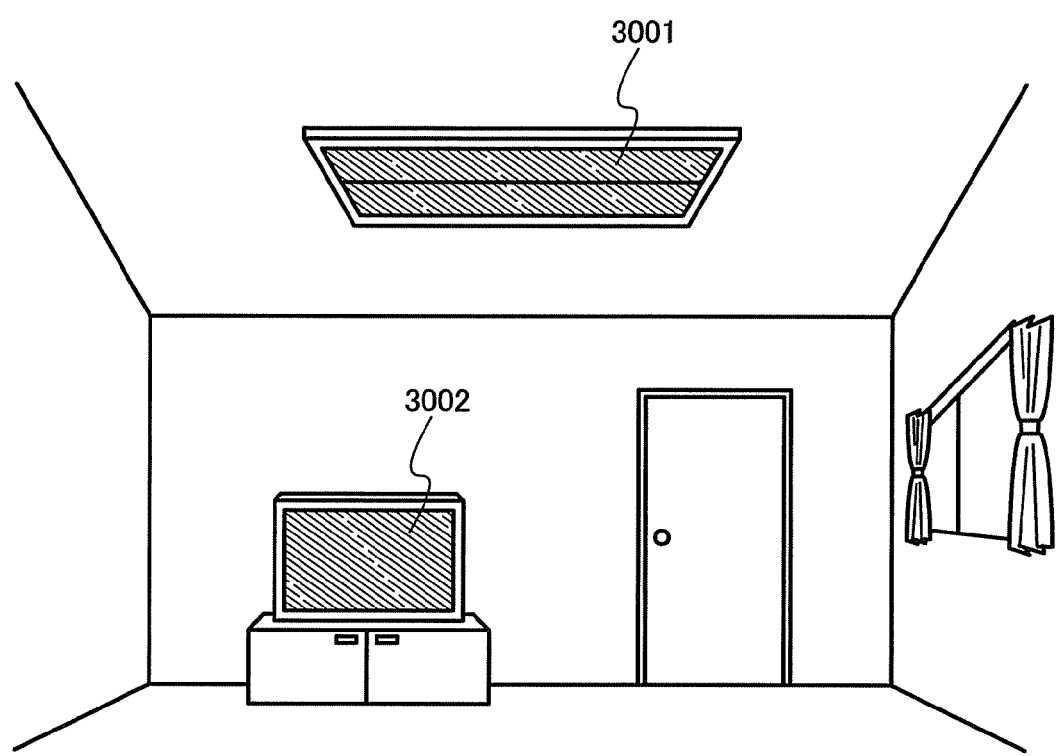
FIG. 17 is a view showing an example of an electronic apparatus according to Embodiment 7 of the present invention.

FIG. 17 illustrates an example in which a light-emitting device to which the present invention is applied is used as an indoor lighting system 3001. Since the area of the light-emitting device of the present invention can be increased, the light-emitting device of the present invention can be used as a lighting system having a large emission area. Thus, a television device 3002 according to the present invention may be placed in a room where the light-emitting device to which the present invention is applied is used as the indoor lighting system 3001 so that public broadcasting or movies can be enjoyed.

As described above, the application range of the present invention is very wide: and the present invention can be used for electronic devices in various fields.

This application is based on Japanese Patent Application serial no. 2008-184970 filed with Japan Patent Office on Jul. 16, 2008, the entire contents of which are hereby incorporated by reference.

What is claimed is:

1. A driving method of a light-emitting device comprising:
   a driving transistor;
   an electroluminescence element;
   a first transistor;
   a first power source; and
   a second power source,
   wherein one of a source and a drain of the driving transistor is electrically connected to the first power source, and the other of the source and the drain of the driving transistor is electrically connected to one of a source and a drain of the first transistor and a first electrode of the electroluminescence element, and
   wherein a second electrode of the electroluminescence element is electrically connected to the second power source, comprising the steps of:
   detecting a first potential of the first electrode of the electroluminescence element through the first transistor in a first period in which the driving transistor is on-state;
   detecting a second potential of the first electrode of the electroluminescence element through the first transistor in a second period in which the driving transistor is on-state; and
   changing a reference potential of the second power source based on a difference between the first potential and the second potential, so that a reduction in luminance of the electroluminescence element is compensated.

2. A driving method of a light-emitting device according to claim 1, wherein the first potential and the second potential are detected when a luminance of the electroluminescence element is decayed.

3. A driving method of a light-emitting device according to claim 1, wherein the first electrode of the electroluminescence element is electrically connected to the first power source and the reference potential is increased by the difference between the first potential and the second potential, or more in a negative direction when a potential of the first power source is positive.

4. A driving method of a light-emitting device according to claim 1, wherein the first the of the electroluminescence element is electrically connected to the first power source and the reference potential is increased by the difference between the first potential and the second potential, or more in a positive direction when a potential of the first power source is negative.

5. A driving method of a light-emitting device comprising:
a driving transistor;
an electroluminescence element;
a first transistor;
a second transistor;
a first power source; and
a second power source,
wherein one of a source and a drain of the driving transistor is electrically connected to the first power source, and the other of the source and the drain of the driving transistor is electrically connected to one of a source and a drain of the first transistor and a first electrode of the electroluminescence element, and
wherein a second electrode of the electroluminescence element is electrically connected to the second power source, comprising the steps of:
detecting a first signal by applying a first potential of the first electrode of the electroluminescence element to a gate of the second transistor through the first transistor in a first period in which the driving transistor is on-state;
detecting a second signal by applying a second potential of the first electrode of the electroluminescence element to the gate of the second transistor through the first transistor in a second period in which the driving transistor is on-state; and
changing a reference potential of the second power source based on a difference between the first potential and the second potential, so that a reduction in luminance of the electroluminescence element is compensated.

6. A driving method of a light-emitting device according to claim 5, wherein the first potential and the second potential are detected when a luminance of the electroluminescence element is decayed.

7. A driving method of a light-emitting device according to claim 5, wherein the first electrode of the electroluminescence element is electrically connected to the first power source and the reference potential is increased by the difference between the first potential and the second potential, or more in a negative direction when a potential of the first power source is positive.

8. A driving method of a light-emitting device according to claim 5, wherein the first electrode of the electroluminescence element is electrically connected to the first power source and the reference potential is increased by the difference between the first potential and the second potential, or more in a positive direction when a potential of the first power source is negative.

* * * * *

UNITED STATES PATENT AND TRADEMARK OFFICE
CERTIFICATE OF CORRECTION

PATENT NO. : 8,441,418 B2  
APPLICATION NO. : 12/501837  
DATED : May 14, 2013  
INVENTOR(S) : Tatsuya Honda Page 1 of 1

It is certified that error appears in the above-identified patent and that said Letters Patent is hereby corrected as shown below:

In the Specification:

Column 25, line 67; Change "portion (13) 3505," to --portion (B) 3505,--.
Column 26, line 3; Change "portion (13) 3505." to --portion (B) 3505.--.

In the Claims:

Column 26, line 62, Claim 4; Change "first the of" to --first electrode of--.

Signed and Sealed this
Second Day of July, 2013

Teresa Stanek Rea
*Acting Director of the United States Patent and Trademark Office*